United States Patent
Shaw et al.

(10) Patent No.: US 9,158,383 B2
(45) Date of Patent: Oct. 13, 2015

(54) FORCE CONCENTRATOR

(75) Inventors: Timothy C. Shaw, Sammamish, WA (US); Jim Tom Belesiu, Mill Creek, WA (US); Sharon Drasnin, Seattle, WA (US); Christopher Harry Stoumbos, Sammamish, WA (US); Paul Henry Dietz, Redmond, WA (US); Dennis J. Mathias, Kenmore, WA (US); Rob Huala, Bellevue, WA (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 308 days.

(21) Appl. No.: 13/468,949

(22) Filed: May 10, 2012

(65) Prior Publication Data

US 2013/0228433 A1 Sep. 5, 2013

Related U.S. Application Data

(60) Provisional application No. 61/606,321, filed on Mar. 2, 2012, provisional application No. 61/606,301, filed (Continued)

(51) Int. Cl.
*H01H 9/26* (2006.01)
*H01H 13/72* (2006.01)
(Continued)

(52) U.S. Cl.
CPC .............. *G06F 3/0202* (2013.01); *G05B 11/01* (2013.01); *G06F 1/1618* (2013.01);
(Continued)

(58) Field of Classification Search
CPC ......... H01H 9/26; H01H 13/72; H01H 13/76; H01H 1/00; H01H 1/50; H01H 3/00; H01H 3/02; H01H 3/12; H01H 13/00; H01H 2001/00; H01H 2001/24; H01H 2001/50; H01H 2003/12; H01H 17/00; H01H 2013/52; H01H 2205/00; H01H 2205/004; H01H 2205/032; H01H 2209/00; H01H 2215/00; H01H 2217/016; H01H 2221/00; H01H 2221/05; H01H 2221/076; H01H 2221/09; H01H 2223/003; H01H 2239/074
USPC .................. 200/600, 46, 5 R, 5 A, 292, 243; 345/173; 178/18.01, 18.06
See application file for complete search history.

(56) References Cited

U.S. PATENT DOCUMENTS

| 578,325 A | 3/1897 | Fleming |
|---|---|---|
| 3,600,528 A | 8/1971 | Leposavic |

(Continued)

FOREIGN PATENT DOCUMENTS

| CA | 990023 | 6/1976 |
|---|---|---|
| CN | 1352767 | 6/2002 |

(Continued)

OTHER PUBLICATIONS

"Cirago Slim Case®—Protective case with built-in kickstand for your iPhone 5®", Retrieved from <http://cirago.com/wordpress/wp-content/uploads/2012/10/ipc1500brochure1.pdf> on Jan. 29, 2013, 1 page.

(Continued)

*Primary Examiner* — Edwin A. Leon
*Assistant Examiner* — Anthony R. Jimenez
(74) *Attorney, Agent, or Firm* — Brandon Roper; Judy Yee; Micky Minhas

(57) ABSTRACT

Force concentrator techniques are described. In one or more implementations, a pressure sensitive key includes a sensor substrate having a plurality of conductors, a flexible contact layer spaced apart from the sensor substrate and configured to flex to contact the sensor substrate to initiate an input; and a force concentrator layer disposed proximal to the flexible contact layer on a side opposite the sensor substrate. The force concentrator layer has a pad disposed thereon that is configured to cause pressure applied to the force concentrator layer to be channeled through the pad to cause the flexible contact layer to contact the sensor substrate to initiate the input.

19 Claims, 7 Drawing Sheets

Related U.S. Application Data on Mar. 2, 2012, provisional application No. 61/606,313, filed on Mar. 2, 2012, provisional application No. 61/606,333, filed on Mar. 2, 2012, provisional application No. 61/613,745, filed on Mar. 21, 2012, provisional application No. 61/606,336, filed on Mar. 2, 2012, provisional application No. 61/607,451, filed on Mar. 6, 2012.

(51) Int. Cl.

| | | |
|---|---|---|
| *H01H 13/76* | (2006.01) | |
| *G06F 3/02* | (2006.01) | |
| *H01H 13/79* | (2006.01) | |
| *H01H 13/78* | (2006.01) | |
| *H01H 13/785* | (2006.01) | |
| *G06F 1/16* | (2006.01) | |
| *H05K 5/02* | (2006.01) | |
| *H04M 1/02* | (2006.01) | |
| *H04M 1/725* | (2006.01) | |
| *G05B 11/01* | (2006.01) | |
| *G06F 3/041* | (2006.01) | |
| *H01H 13/704* | (2006.01) | |
| *H01H 13/82* | (2006.01) | |
| *G06F 3/00* | (2006.01) | |
| *G06F 3/01* | (2006.01) | |
| *H01H 13/702* | (2006.01) | |
| *H01H 13/14* | (2006.01) | |
| *H01H 13/703* | (2006.01) | |
| *G06F 9/54* | (2006.01) | |
| *G06F 11/30* | (2006.01) | |
| *G06F 13/10* | (2006.01) | |
| *G06F 3/023* | (2006.01) | |

(52) U.S. Cl.
CPC ............ *G06F 1/1654* (2013.01); *G06F 1/1656* (2013.01); *G06F 1/1662* (2013.01); *G06F 1/1669* (2013.01); *G06F 1/1681* (2013.01); *G06F 1/1683* (2013.01); *G06F 1/1684* (2013.01); *G06F 3/002* (2013.01); *G06F 3/01* (2013.01); *G06F 3/023* (2013.01); *G06F 3/0414* (2013.01); *G06F 3/0416* (2013.01); *G06F 9/541* (2013.01); *G06F 11/3089* (2013.01); *G06F 13/102* (2013.01); *H01H 13/14* (2013.01); *H01H 13/702* (2013.01); *H01H 13/703* (2013.01); *H01H 13/704* (2013.01); *H01H 13/78* (2013.01); *H01H 13/785* (2013.01); *H01H 13/79* (2013.01); *H01H 13/82* (2013.01); *H04M 1/0216* (2013.01); *H04M 1/0254* (2013.01); *H04M 1/72527* (2013.01); *H05K 5/0226* (2013.01); *H05K 5/0234* (2013.01); *H01H 9/26* (2013.01); *H01H 2201/036* (2013.01); *H01H 2205/006* (2013.01); *H01H 2211/006* (2013.01); *H01H 2217/004* (2013.01); *H04M 1/0245* (2013.01); *Y10T 16/5401* (2015.01); *Y10T 16/551* (2015.01); *Y10T 29/49826* (2015.01)

(56) References Cited

U.S. PATENT DOCUMENTS

| | | |
|---|---|---|
| 3,777,082 A | 12/1973 | Hatley |
| 3,879,586 A | 4/1975 | DuRocher et al. |
| 3,968,336 A | 7/1976 | Johnson |
| 4,046,975 A | 9/1977 | Seeger, Jr. |
| 4,065,649 A | 12/1977 | Carter et al. |
| 4,086,451 A * | 4/1978 | Boulanger .................. 200/5 A |
| 4,243,861 A | 1/1981 | Strandwitz |
| 4,261,042 A | 4/1981 | Ishiwatari et al. |
| 4,302,648 A | 11/1981 | Sado et al. |
| 4,317,013 A | 2/1982 | Larson |
| 4,365,130 A | 12/1982 | Christensen |
| 4,492,829 A | 1/1985 | Rodrique |
| 4,503,294 A | 3/1985 | Matsumaru |
| 4,527,021 A | 7/1985 | Morikawa et al. |
| 4,559,426 A | 12/1985 | Van Zeeland et al. |
| 4,577,822 A | 3/1986 | Wilkerson |
| 4,588,187 A | 5/1986 | Dell |
| 4,607,147 A | 8/1986 | Ono et al. |
| 4,651,133 A | 3/1987 | Ganesan et al. |
| 4,735,394 A | 4/1988 | Facco |
| 4,824,268 A | 4/1989 | Diernisse |
| 4,864,084 A * | 9/1989 | Cardinale ................... 200/5 A |
| 4,996,511 A | 2/1991 | Ohkawa et al. |
| 5,008,497 A | 4/1991 | Asher |
| 5,021,638 A | 6/1991 | Nopper et al. |
| 5,107,401 A | 4/1992 | Youn |
| 5,128,829 A | 7/1992 | Loew |
| 5,220,318 A | 6/1993 | Staley |
| 5,220,521 A | 6/1993 | Kikinis |
| 5,235,495 A | 8/1993 | Blair et al. |
| 5,283,559 A | 2/1994 | Kalendra et al. |
| 5,331,443 A | 7/1994 | Stanisci |
| 5,363,075 A | 11/1994 | Fanucchi |
| 5,375,076 A | 12/1994 | Goodrich et al. |
| 5,404,133 A | 4/1995 | Moriike et al. |
| 5,480,118 A | 1/1996 | Cross |
| 5,491,313 A | 2/1996 | Bartley et al. |
| 5,546,271 A | 8/1996 | Gut et al. |
| 5,548,477 A | 8/1996 | Kumar et al. |
| 5,558,577 A | 9/1996 | Kato |
| 5,618,232 A | 4/1997 | Martin |
| 5,661,279 A | 8/1997 | Kenmochi |
| 5,666,112 A | 9/1997 | Crowley et al. |
| 5,681,220 A | 10/1997 | Bertram et al. |
| 5,737,183 A | 4/1998 | Kobayashi et al. |
| 5,745,376 A | 4/1998 | Barker et al. |
| 5,748,114 A | 5/1998 | Koehn |
| 5,781,406 A | 7/1998 | Hunte |
| 5,807,175 A | 9/1998 | Davis et al. |
| 5,818,361 A | 10/1998 | Acevedo |
| 5,828,770 A | 10/1998 | Leis et al. |
| 5,842,027 A | 11/1998 | Oprescu et al. |
| 5,874,697 A | 2/1999 | Selker et al. |
| 5,905,485 A | 5/1999 | Podoloff |
| 5,924,555 A * | 7/1999 | Sadamori et al. ............ 200/512 |
| 5,926,170 A | 7/1999 | Oba |
| 5,948,990 A | 9/1999 | Hashida |
| 5,971,635 A | 10/1999 | Wise |
| 6,002,389 A | 12/1999 | Kasser |
| 6,005,209 A | 12/1999 | Burleson et al. |
| 6,012,714 A | 1/2000 | Worley et al. |
| 6,040,823 A | 3/2000 | Seffernick et al. |
| 6,042,075 A | 3/2000 | Burch, Jr. |
| 6,044,717 A | 4/2000 | Biegelsen et al. |
| 6,055,705 A | 5/2000 | Komatsu et al. |
| 6,061,644 A | 5/2000 | Leis |
| 6,108,200 A | 8/2000 | Fullerton |
| 6,112,797 A | 9/2000 | Colson et al. |
| 6,128,007 A | 10/2000 | Seybold |
| 6,141,388 A | 10/2000 | Servais et al. |
| 6,178,085 B1 | 1/2001 | Leung |
| 6,178,443 B1 | 1/2001 | Lin |
| 6,188,391 B1 | 2/2001 | Seely et al. |
| 6,254,105 B1 | 7/2001 | Rinde et al. |
| 6,279,060 B1 | 8/2001 | Luke et al. |
| 6,329,617 B1 | 12/2001 | Burgess |
| 6,344,791 B1 | 2/2002 | Armstrong |
| 6,366,440 B1 | 4/2002 | Kung |
| 6,380,497 B1 | 4/2002 | Hashimoto et al. |
| 6,437,682 B1 | 8/2002 | Vance |
| 6,450,046 B1 | 9/2002 | Maeda |
| 6,506,983 B1 | 1/2003 | Babb et al. |
| 6,511,378 B1 | 1/2003 | Bhatt et al. |
| 6,532,147 B1 | 3/2003 | Christ, Jr. |
| 6,543,949 B1 | 4/2003 | Ritchey et al. |
| 6,555,024 B2 | 4/2003 | Ueda et al. |

(56) References Cited

U.S. PATENT DOCUMENTS

| | | |
|---|---|---|
| 6,565,439 B2 | 5/2003 | Shinohara et al. |
| 6,585,435 B2 | 7/2003 | Fang |
| 6,597,347 B1 | 7/2003 | Yasutake |
| 6,600,121 B1 | 7/2003 | Olodort et al. |
| 6,603,408 B1 | 8/2003 | Gaba |
| 6,603,461 B2 | 8/2003 | Smith, Jr. et al. |
| 6,608,664 B1 | 8/2003 | Hasegawa |
| 6,617,536 B2 | 9/2003 | Kawaguchi |
| 6,651,943 B2 | 11/2003 | Cho et al. |
| 6,684,166 B2 | 1/2004 | Bellwood et al. |
| 6,685,369 B2 | 2/2004 | Lien |
| 6,687,614 B2 | 2/2004 | Ihara et al. |
| 6,695,273 B2 | 2/2004 | Iguchi |
| 6,704,864 B1 | 3/2004 | Philyaw |
| 6,721,019 B2 | 4/2004 | Kono et al. |
| 6,725,318 B1 | 4/2004 | Sherman et al. |
| 6,774,888 B2 | 8/2004 | Genduso |
| 6,776,546 B2 | 8/2004 | Kraus et al. |
| 6,780,019 B1 | 8/2004 | Ghosh et al. |
| 6,781,819 B2 | 8/2004 | Yang et al. |
| 6,784,869 B1 | 8/2004 | Clark et al. |
| 6,798,887 B1 | 9/2004 | Andre |
| 6,813,143 B2 | 11/2004 | Makela |
| 6,819,316 B2 | 11/2004 | Schulz et al. |
| 6,856,506 B2 | 2/2005 | Doherty et al. |
| 6,856,789 B2 | 2/2005 | Pattabiraman et al. |
| 6,861,961 B2 | 3/2005 | Sandbach et al. |
| 6,898,315 B2 | 5/2005 | Guha |
| 6,909,354 B2 | 6/2005 | Baker et al. |
| 6,914,197 B2 | 7/2005 | Doherty et al. |
| 6,950,950 B2 | 9/2005 | Sawyers et al. |
| 6,962,454 B1 | 11/2005 | Costello |
| 6,970,957 B1 | 11/2005 | Oshins et al. |
| 6,976,799 B2 | 12/2005 | Kim et al. |
| 7,007,238 B2 | 2/2006 | Glaser |
| 7,051,149 B2 | 5/2006 | Wang et al. |
| 7,083,295 B1 | 8/2006 | Hanna |
| 7,091,436 B2 | 8/2006 | Serban |
| 7,099,149 B2 | 8/2006 | Krieger et al. |
| 7,106,222 B2 | 9/2006 | Ward et al. |
| 7,123,292 B1 | 10/2006 | Seeger et al. |
| D535,292 S | 1/2007 | Shi et al. |
| 7,194,662 B2 | 3/2007 | Do et al. |
| 7,213,323 B2 | 5/2007 | Baker et al. |
| 7,213,991 B2 | 5/2007 | Chapman et al. |
| 7,252,512 B2 | 8/2007 | Tai et al. |
| 7,260,221 B1 | 8/2007 | Atsmon |
| 7,277,087 B2 | 10/2007 | Hill et al. |
| 7,280,348 B2 | 10/2007 | Ghosh |
| 7,301,759 B2 | 11/2007 | Hsiung |
| 7,348,513 B2 | 3/2008 | Lin |
| 7,365,967 B2 | 4/2008 | Zheng |
| 7,415,676 B2 | 8/2008 | Fujita |
| 7,447,934 B2 | 11/2008 | Dasari et al. |
| 7,457,108 B2 | 11/2008 | Ghosh |
| 7,469,386 B2 | 12/2008 | Bear et al. |
| 7,486,165 B2 | 2/2009 | Ligtenberg et al. |
| 7,499,037 B2 | 3/2009 | Lube |
| 7,502,803 B2 | 3/2009 | Culter et al. |
| 7,528,337 B2 | 5/2009 | Tanabe et al. |
| 7,539,882 B2 | 5/2009 | Jessup et al. |
| 7,542,052 B2 | 6/2009 | Solomon et al. |
| 7,558,594 B2 | 7/2009 | Wilson |
| 7,559,834 B1 | 7/2009 | York |
| RE40,891 E | 9/2009 | Yasutake |
| 7,594,638 B2 | 9/2009 | Chan et al. |
| 7,620,244 B1 | 11/2009 | Collier |
| 7,636,921 B2 | 12/2009 | Louie |
| 7,639,329 B2 | 12/2009 | Takeda et al. |
| 7,656,392 B2 | 2/2010 | Bolender |
| 7,729,493 B2 | 6/2010 | Krieger et al. |
| 7,731,147 B2 | 6/2010 | Rha |
| 7,733,326 B1 | 6/2010 | Adiseshan |
| 7,761,119 B2 | 7/2010 | Patel |
| 7,773,076 B2 | 8/2010 | Pittel et al. |
| 7,777,972 B1 | 8/2010 | Chen et al. |
| 7,782,342 B2 | 8/2010 | Koh |
| 7,813,715 B2 | 10/2010 | McKillop et al. |
| 7,822,338 B2 | 10/2010 | Wernersson |
| 7,865,639 B2 | 1/2011 | McCoy et al. |
| 7,884,807 B2 | 2/2011 | Hovden et al. |
| 7,893,921 B2 | 2/2011 | Sato |
| D636,397 S | 4/2011 | Green |
| 7,928,964 B2 | 4/2011 | Kolmykov-Zotov et al. |
| 7,932,890 B2 | 4/2011 | Onikiri et al. |
| 7,944,520 B2 | 5/2011 | Ichioka et al. |
| 7,945,717 B2 | 5/2011 | Rivalsi |
| 7,973,771 B2 | 7/2011 | Geaghan |
| 7,978,281 B2 | 7/2011 | Vergith et al. |
| 8,016,255 B2 | 9/2011 | Lin |
| 8,026,904 B2 | 9/2011 | Westerman |
| 8,053,688 B2 | 11/2011 | Conzola et al. |
| 8,059,384 B2 | 11/2011 | Park et al. |
| 8,065,624 B2 | 11/2011 | Morin et al. |
| 8,069,356 B2 | 11/2011 | Rathi et al. |
| 8,077,160 B2 | 12/2011 | Land et al. |
| 8,090,885 B2 | 1/2012 | Callaghan et al. |
| 8,098,233 B2 | 1/2012 | Hotelling et al. |
| 8,115,499 B2 | 2/2012 | Osoinach et al. |
| 8,117,362 B2 | 2/2012 | Rodriguez et al. |
| 8,118,274 B2 | 2/2012 | McClure et al. |
| 8,120,166 B2 | 2/2012 | Koizumi et al. |
| 8,130,203 B2 | 3/2012 | Westerman |
| 8,149,219 B2 | 4/2012 | Lii et al. |
| 8,154,524 B2 | 4/2012 | Wilson et al. |
| 8,162,282 B2 | 4/2012 | Hu et al. |
| D659,139 S | 5/2012 | Gengler |
| 8,169,421 B2 | 5/2012 | Wright et al. |
| 8,229,509 B2 | 7/2012 | Paek et al. |
| 8,229,522 B2 | 7/2012 | Kim et al. |
| 8,231,099 B2 | 7/2012 | Chen |
| 8,243,432 B2 | 8/2012 | Duan et al. |
| 8,248,791 B2 | 8/2012 | Wang et al. |
| 8,255,708 B1 | 8/2012 | Zhang |
| 8,264,310 B2 | 9/2012 | Lauder et al. |
| 8,267,368 B2 | 9/2012 | Torii et al. |
| 8,269,731 B2 | 9/2012 | Molne |
| 8,274,784 B2 | 9/2012 | Franz et al. |
| 8,279,589 B2 | 10/2012 | Kim |
| 8,322,290 B1 | 12/2012 | Mignano |
| 8,346,206 B1 | 1/2013 | Andrus et al. |
| 8,371,174 B2 | 2/2013 | Chen et al. |
| 8,373,664 B2 | 2/2013 | Wright |
| 8,384,566 B2 | 2/2013 | Bocirnea |
| 8,387,078 B2 | 2/2013 | Memmott |
| 8,387,938 B2 | 3/2013 | Lin |
| 8,403,576 B2 | 3/2013 | Merz |
| 8,416,559 B2 | 4/2013 | Agata et al. |
| 8,424,160 B2 | 4/2013 | Chen |
| 8,464,079 B2 | 6/2013 | Chueh et al. |
| 8,498,100 B1 | 7/2013 | Whitt, III et al. |
| 8,514,568 B2 | 8/2013 | Qiao et al. |
| 8,520,371 B2 | 8/2013 | Peng et al. |
| 8,543,227 B1 | 9/2013 | Perek et al. |
| 8,548,608 B2 | 10/2013 | Perek et al. |
| 8,564,944 B2 | 10/2013 | Whitt, III et al. |
| 8,570,725 B2 | 10/2013 | Whitt, III et al. |
| 8,582,280 B2 | 11/2013 | Ryu |
| 8,587,701 B2 | 11/2013 | Tatsuzawa |
| 8,599,542 B1 | 12/2013 | Healey et al. |
| 8,610,015 B2 | 12/2013 | Whitt et al. |
| 8,614,666 B2 | 12/2013 | Whitman et al. |
| 8,646,999 B2 | 2/2014 | Shaw et al. |
| 8,674,941 B2 | 3/2014 | Casparian et al. |
| 8,699,215 B2 | 4/2014 | Whitt, III et al. |
| 8,719,603 B2 | 5/2014 | Belesiu et al. |
| 8,724,302 B2 | 5/2014 | Whitt et al. |
| 8,744,070 B2 | 6/2014 | Zhang et al. |
| 8,744,391 B2 | 6/2014 | Tenbrook et al. |
| 8,762,746 B1 | 6/2014 | Lachwani et al. |
| 8,767,388 B2 | 7/2014 | Ahn et al. |
| 8,780,540 B2 | 7/2014 | Whitt, III et al. |
| 8,780,541 B2 | 7/2014 | Whitt et al. |
| 8,791,382 B2 | 7/2014 | Whitt, III et al. |

(56) References Cited

U.S. PATENT DOCUMENTS

| | | |
|---|---|---|
| 8,797,765 B2 | 8/2014 | Lin et al. |
| 8,825,187 B1 | 9/2014 | Hamrick et al. |
| 8,830,668 B2 | 9/2014 | Whitt, III et al. |
| 8,850,241 B2 | 9/2014 | Oler et al. |
| 8,854,799 B2 | 10/2014 | Whitt, III et al. |
| 8,873,227 B2 | 10/2014 | Whitt et al. |
| 8,891,232 B2 | 11/2014 | Wang |
| 8,896,993 B2 | 11/2014 | Belesiu et al. |
| 8,903,517 B2 | 12/2014 | Perek et al. |
| 8,908,858 B2 | 12/2014 | Chiu et al. |
| 8,934,221 B2 | 1/2015 | Guo |
| 8,935,774 B2 | 1/2015 | Belesiu et al. |
| 8,939,422 B2 | 1/2015 | Liu et al. |
| 8,947,864 B2 | 2/2015 | Whitt, III et al. |
| 8,949,477 B2 | 2/2015 | Drasnin |
| 8,952,892 B2 | 2/2015 | Chai |
| 8,964,376 B2 | 2/2015 | Chen |
| 8,991,473 B2 | 3/2015 | Bornemann et al. |
| 9,027,631 B2 | 5/2015 | Bornemann et al. |
| 9,047,207 B2 | 6/2015 | Belesiu et al. |
| 9,064,654 B2 | 6/2015 | Whitt, III et al. |
| 9,075,566 B2 | 7/2015 | Whitt, III et al. |
| 9,098,117 B2 | 8/2015 | Lutz, III et al. |
| 2001/0023818 A1 | 9/2001 | Masaru et al. |
| 2002/0005108 A1 | 1/2002 | Ludwig |
| 2002/0044216 A1 | 4/2002 | Cha |
| 2002/0070883 A1 | 6/2002 | Dosch |
| 2002/0134828 A1 | 9/2002 | Sandbach et al. |
| 2002/0135457 A1 | 9/2002 | Sandbach et al. |
| 2002/0195177 A1 | 12/2002 | Hinkley et al. |
| 2003/0007648 A1 | 1/2003 | Currell |
| 2003/0011576 A1 | 1/2003 | Sandbach et al. |
| 2003/0051983 A1 | 3/2003 | Lahr |
| 2003/0067450 A1 | 4/2003 | Thursfield et al. |
| 2003/0108720 A1 | 6/2003 | Kashino |
| 2003/0163611 A1 | 8/2003 | Nagao |
| 2003/0197687 A1 | 10/2003 | Shetter |
| 2003/0231243 A1 | 12/2003 | Shibutani |
| 2004/0005184 A1 | 1/2004 | Kim et al. |
| 2004/0046796 A1 | 3/2004 | Fujita |
| 2004/0056843 A1 | 3/2004 | Lin et al. |
| 2004/0095333 A1 | 5/2004 | Morag et al. |
| 2004/0113956 A1 | 6/2004 | Bellwood et al. |
| 2004/0156168 A1 | 8/2004 | LeVasseur et al. |
| 2004/0160734 A1 | 8/2004 | Yim |
| 2004/0169641 A1 | 9/2004 | Bean et al. |
| 2004/0212598 A1 | 10/2004 | Kraus et al. |
| 2004/0212601 A1 | 10/2004 | Cake et al. |
| 2004/0231969 A1 | 11/2004 | Kitano et al. |
| 2004/0258924 A1 | 12/2004 | Berger et al. |
| 2004/0268000 A1 | 12/2004 | Barker et al. |
| 2005/0030728 A1 | 2/2005 | Kawashima et al. |
| 2005/0047773 A1 | 3/2005 | Satake et al. |
| 2005/0052831 A1 | 3/2005 | Chen |
| 2005/0055498 A1 | 3/2005 | Beckert et al. |
| 2005/0057515 A1 | 3/2005 | Bathiche |
| 2005/0059489 A1 | 3/2005 | Kim |
| 2005/0062715 A1 | 3/2005 | Tsuji et al. |
| 2005/0099400 A1 | 5/2005 | Lee |
| 2005/0134717 A1 | 6/2005 | Misawa |
| 2005/0146512 A1 | 7/2005 | Hill et al. |
| 2005/0236848 A1 | 10/2005 | Kim et al. |
| 2005/0264653 A1 | 12/2005 | Starkweather et al. |
| 2005/0264988 A1 | 12/2005 | Nicolosi |
| 2005/0283731 A1 | 12/2005 | Saint-Hilaire et al. |
| 2005/0285703 A1 | 12/2005 | Wheeler et al. |
| 2006/0049920 A1 | 3/2006 | Sadler et al. |
| 2006/0061555 A1 | 3/2006 | Mullen |
| 2006/0085658 A1 | 4/2006 | Allen et al. |
| 2006/0092139 A1 | 5/2006 | Sharma |
| 2006/0096392 A1 | 5/2006 | Inkster et al. |
| 2006/0125799 A1 | 6/2006 | Hillis et al. |
| 2006/0152499 A1 | 7/2006 | Roberts |
| 2006/0154725 A1 | 7/2006 | Glaser et al. |
| 2006/0155391 A1 | 7/2006 | Pistemaa et al. |
| 2006/0156415 A1 | 7/2006 | Rubinstein et al. |
| 2006/0174143 A1 | 8/2006 | Sawyers et al. |
| 2006/0176377 A1 | 8/2006 | Miyasaka |
| 2006/0181514 A1 | 8/2006 | Newman |
| 2006/0187216 A1 | 8/2006 | Trent, Jr. et al. |
| 2006/0192763 A1 | 8/2006 | Ziemkowski |
| 2006/0195522 A1 | 8/2006 | Miyazaki |
| 2006/0265617 A1 | 11/2006 | Priborsky |
| 2006/0267931 A1 | 11/2006 | Vainio et al. |
| 2006/0272429 A1 | 12/2006 | Ganapathi et al. |
| 2007/0003267 A1 | 1/2007 | Shibutani |
| 2007/0056385 A1 | 3/2007 | Lorenz |
| 2007/0062089 A1 | 3/2007 | Homer et al. |
| 2007/0069153 A1 | 3/2007 | Pai-Paranjape et al. |
| 2007/0072474 A1 | 3/2007 | Beasley et al. |
| 2007/0117600 A1 | 5/2007 | Robertson et al. |
| 2007/0121956 A1 | 5/2007 | Bai et al. |
| 2007/0145945 A1 | 6/2007 | McGinley et al. |
| 2007/0172229 A1 | 7/2007 | Wernersson |
| 2007/0176902 A1 | 8/2007 | Newman et al. |
| 2007/0178891 A1 | 8/2007 | Louch et al. |
| 2007/0182663 A1 | 8/2007 | Biech |
| 2007/0182722 A1 | 8/2007 | Hotelling et al. |
| 2007/0185590 A1 | 8/2007 | Reindel et al. |
| 2007/0200830 A1 | 8/2007 | Yamamoto |
| 2007/0220708 A1 | 9/2007 | Lewis |
| 2007/0230227 A1 | 10/2007 | Palmer |
| 2007/0234420 A1 | 10/2007 | Novotney et al. |
| 2007/0236408 A1 | 10/2007 | Yamaguchi et al. |
| 2007/0236475 A1 | 10/2007 | Wherry |
| 2007/0236873 A1 | 10/2007 | Yukawa et al. |
| 2007/0247432 A1 | 10/2007 | Oakley |
| 2007/0252674 A1 | 11/2007 | Nelson et al. |
| 2007/0260892 A1 | 11/2007 | Paul et al. |
| 2007/0283179 A1 | 12/2007 | Burnett et al. |
| 2007/0296709 A1 | 12/2007 | Guanghai |
| 2007/0297625 A1 | 12/2007 | Hjort et al. |
| 2008/0005423 A1 | 1/2008 | Jacobs et al. |
| 2008/0053222 A1 | 3/2008 | Ehrensvard et al. |
| 2008/0059888 A1 | 3/2008 | Dunko |
| 2008/0074398 A1 | 3/2008 | Wright |
| 2008/0104437 A1 | 5/2008 | Lee |
| 2008/0129520 A1 | 6/2008 | Lee |
| 2008/0151478 A1 | 6/2008 | Chern |
| 2008/0158185 A1 | 7/2008 | Westerman |
| 2008/0167832 A1 | 7/2008 | Soss |
| 2008/0174570 A1 | 7/2008 | Jobs et al. |
| 2008/0186660 A1 | 8/2008 | Yang |
| 2008/0228969 A1 | 9/2008 | Cheah et al. |
| 2008/0238884 A1 | 10/2008 | Harish |
| 2008/0253822 A1 | 10/2008 | Matias |
| 2008/0307242 A1 | 12/2008 | Qu |
| 2008/0316002 A1 | 12/2008 | Brunet et al. |
| 2008/0316183 A1 | 12/2008 | Westerman et al. |
| 2008/0320190 A1 | 12/2008 | Lydon et al. |
| 2009/0009476 A1 | 1/2009 | Daley, III |
| 2009/0073957 A1 | 3/2009 | Newland et al. |
| 2009/0083562 A1 | 3/2009 | Park et al. |
| 2009/0089600 A1 | 4/2009 | Nousiainen |
| 2009/0096756 A1 | 4/2009 | Lube |
| 2009/0102805 A1 | 4/2009 | Meijer et al. |
| 2009/0127005 A1 | 5/2009 | Zachut et al. |
| 2009/0131134 A1 | 5/2009 | Baerlocher et al. |
| 2009/0140985 A1 | 6/2009 | Liu |
| 2009/0158221 A1 | 6/2009 | Nielsen et al. |
| 2009/0174759 A1 | 7/2009 | Yeh et al. |
| 2009/0189873 A1 | 7/2009 | Peterson |
| 2009/0195497 A1 | 8/2009 | Fitzgerald et al. |
| 2009/0195518 A1 | 8/2009 | Mattice et al. |
| 2009/0207144 A1 | 8/2009 | Bridger |
| 2009/0231275 A1 | 9/2009 | Odgers |
| 2009/0239586 A1 | 9/2009 | Boeve et al. |
| 2009/0244832 A1 | 10/2009 | Behar et al. |
| 2009/0244872 A1 | 10/2009 | Yan |
| 2009/0251008 A1 | 10/2009 | Sugaya |
| 2009/0259865 A1 | 10/2009 | Sheynblat et al. |
| 2009/0262492 A1 | 10/2009 | Whitchurch et al. |
| 2009/0265670 A1 | 10/2009 | Kim et al. |
| 2009/0285491 A1 | 11/2009 | Ravenscroft et al. |

(56) References Cited

U.S. PATENT DOCUMENTS

| | | |
|---|---|---|
| 2009/0296331 A1 | 12/2009 | Choy |
| 2009/0303204 A1 | 12/2009 | Nasiri et al. |
| 2009/0315830 A1 | 12/2009 | Westerman |
| 2009/0320244 A1 | 12/2009 | Lin |
| 2009/0321490 A1 | 12/2009 | Groene et al. |
| 2010/0013319 A1 | 1/2010 | Kamiyama et al. |
| 2010/0023869 A1 | 1/2010 | Saint-Hilaire et al. |
| 2010/0026656 A1 | 2/2010 | Hotelling et al. |
| 2010/0038821 A1 | 2/2010 | Jenkins et al. |
| 2010/0039081 A1 | 2/2010 | Sip |
| 2010/0039764 A1 | 2/2010 | Locker et al. |
| 2010/0045609 A1 | 2/2010 | Do et al. |
| 2010/0045633 A1 | 2/2010 | Gettemy |
| 2010/0051356 A1 | 3/2010 | Stern et al. |
| 2010/0051432 A1 | 3/2010 | Lin et al. |
| 2010/0052880 A1 | 3/2010 | Laitinen et al. |
| 2010/0053534 A1 | 3/2010 | Hsieh et al. |
| 2010/0054435 A1 | 3/2010 | Louch et al. |
| 2010/0056130 A1 | 3/2010 | Louch et al. |
| 2010/0073329 A1 | 3/2010 | Raman et al. |
| 2010/0077237 A1 | 3/2010 | Sawyers |
| 2010/0079379 A1 | 4/2010 | Demuynck et al. |
| 2010/0081377 A1 | 4/2010 | Chatterjee et al. |
| 2010/0083108 A1 | 4/2010 | Rider et al. |
| 2010/0085321 A1 | 4/2010 | Pundsack |
| 2010/0102182 A1 | 4/2010 | Lin |
| 2010/0103112 A1 | 4/2010 | Yoo et al. |
| 2010/0105443 A1 | 4/2010 | Vaisanen |
| 2010/0106983 A1 | 4/2010 | Kasprzak et al. |
| 2010/0115309 A1 | 5/2010 | Carvalho et al. |
| 2010/0117993 A1 | 5/2010 | Kent |
| 2010/0123686 A1 | 5/2010 | Klinghult et al. |
| 2010/0133398 A1 | 6/2010 | Chiu et al. |
| 2010/0142130 A1 | 6/2010 | Wang et al. |
| 2010/0148995 A1 | 6/2010 | Elias |
| 2010/0148999 A1 | 6/2010 | Casparian et al. |
| 2010/0149104 A1 | 6/2010 | Sim et al. |
| 2010/0149111 A1 | 6/2010 | Olien |
| 2010/0149134 A1 | 6/2010 | Westerman et al. |
| 2010/0149377 A1 | 6/2010 | Shintani et al. |
| 2010/0156798 A1 | 6/2010 | Archer |
| 2010/0156913 A1 | 6/2010 | Ortega et al. |
| 2010/0161522 A1 | 6/2010 | Tirpak et al. |
| 2010/0164857 A1 | 7/2010 | Liu et al. |
| 2010/0164897 A1 | 7/2010 | Morin et al. |
| 2010/0171891 A1 | 7/2010 | Kaji et al. |
| 2010/0174421 A1 | 7/2010 | Tsai et al. |
| 2010/0180063 A1 | 7/2010 | Ananny et al. |
| 2010/0188299 A1 | 7/2010 | Rinehart et al. |
| 2010/0205472 A1 | 8/2010 | Tupman et al. |
| 2010/0206614 A1 | 8/2010 | Park et al. |
| 2010/0206644 A1 | 8/2010 | Yeh |
| 2010/0214257 A1 | 8/2010 | Wussler et al. |
| 2010/0222110 A1 | 9/2010 | Kim et al. |
| 2010/0231522 A1 | 9/2010 | Li |
| 2010/0235546 A1 | 9/2010 | Terlizzi et al. |
| 2010/0238620 A1 | 9/2010 | Fish |
| 2010/0250988 A1 | 9/2010 | Okuda et al. |
| 2010/0259482 A1 | 10/2010 | Ball |
| 2010/0259876 A1 | 10/2010 | Kim |
| 2010/0265182 A1 | 10/2010 | Ball et al. |
| 2010/0271771 A1 | 10/2010 | Wu et al. |
| 2010/0274932 A1 | 10/2010 | Kose |
| 2010/0279768 A1 | 11/2010 | Huang et al. |
| 2010/0289457 A1 | 11/2010 | Onnerud et al. |
| 2010/0295812 A1 | 11/2010 | Burns et al. |
| 2010/0302378 A1 | 12/2010 | Marks et al. |
| 2010/0304793 A1 | 12/2010 | Kim |
| 2010/0306538 A1 | 12/2010 | Thomas et al. |
| 2010/0308778 A1 | 12/2010 | Yamazaki et al. |
| 2010/0308844 A1 | 12/2010 | Day et al. |
| 2010/0309617 A1 | 12/2010 | Wang et al. |
| 2010/0313680 A1 | 12/2010 | Joung et al. |
| 2010/0315348 A1 | 12/2010 | Jellicoe et al. |
| 2010/0315373 A1 | 12/2010 | Steinhauser et al. |
| 2010/0321877 A1 | 12/2010 | Moser |
| 2010/0324457 A1 | 12/2010 | Bean et al. |
| 2010/0325155 A1 | 12/2010 | Skinner et al. |
| 2010/0331059 A1 | 12/2010 | Apgar et al. |
| 2011/0012873 A1 | 1/2011 | Prest et al. |
| 2011/0019123 A1 | 1/2011 | Prest et al. |
| 2011/0031287 A1 | 2/2011 | Le Gette et al. |
| 2011/0032127 A1 | 2/2011 | Roush |
| 2011/0036965 A1 | 2/2011 | Zhang et al. |
| 2011/0037721 A1 | 2/2011 | Cranfill et al. |
| 2011/0043990 A1 | 2/2011 | Mickey et al. |
| 2011/0050576 A1 | 3/2011 | Forutanpour et al. |
| 2011/0050626 A1 | 3/2011 | Porter et al. |
| 2011/0055407 A1 | 3/2011 | Lydon et al. |
| 2011/0057724 A1 | 3/2011 | Pabon |
| 2011/0060926 A1 | 3/2011 | Brooks et al. |
| 2011/0069148 A1 | 3/2011 | Jones et al. |
| 2011/0074688 A1 | 3/2011 | Hull et al. |
| 2011/0102326 A1 | 5/2011 | Casparian et al. |
| 2011/0102356 A1 | 5/2011 | Kemppinen et al. |
| 2011/0102752 A1 | 5/2011 | Chen et al. |
| 2011/0107958 A1 | 5/2011 | Pance et al. |
| 2011/0113368 A1 | 5/2011 | Carvajal et al. |
| 2011/0115738 A1 | 5/2011 | Suzuki et al. |
| 2011/0117970 A1 | 5/2011 | Choi |
| 2011/0134032 A1 | 6/2011 | Chiu et al. |
| 2011/0134043 A1 | 6/2011 | Chen |
| 2011/0157046 A1 | 6/2011 | Lee et al. |
| 2011/0157087 A1 | 6/2011 | Kanehira et al. |
| 2011/0163955 A1 | 7/2011 | Nasiri et al. |
| 2011/0164370 A1 | 7/2011 | McClure et al. |
| 2011/0167181 A1 | 7/2011 | Minoo et al. |
| 2011/0167287 A1 | 7/2011 | Walsh et al. |
| 2011/0167391 A1 | 7/2011 | Momeyer et al. |
| 2011/0167992 A1 | 7/2011 | Eventoff et al. |
| 2011/0169762 A1 | 7/2011 | Weiss |
| 2011/0176035 A1 | 7/2011 | Poulsen |
| 2011/0179864 A1 | 7/2011 | Raasch et al. |
| 2011/0184646 A1 | 7/2011 | Wong et al. |
| 2011/0184824 A1 | 7/2011 | George et al. |
| 2011/0188199 A1 | 8/2011 | Pan |
| 2011/0191480 A1 | 8/2011 | Kobayashi |
| 2011/0193787 A1 | 8/2011 | Morishige et al. |
| 2011/0199389 A1 | 8/2011 | Lu et al. |
| 2011/0205372 A1 | 8/2011 | Miramontes |
| 2011/0221678 A1 | 9/2011 | Davydov |
| 2011/0227913 A1 | 9/2011 | Hyndman |
| 2011/0231682 A1 | 9/2011 | Kakish et al. |
| 2011/0242138 A1 | 10/2011 | Tribble |
| 2011/0248152 A1 | 10/2011 | Svajda et al. |
| 2011/0248920 A1 | 10/2011 | Larsen |
| 2011/0248941 A1 | 10/2011 | Abdo et al. |
| 2011/0261001 A1 | 10/2011 | Liu |
| 2011/0265287 A1 | 11/2011 | Li et al. |
| 2011/0266672 A1 | 11/2011 | Sylvester |
| 2011/0267272 A1 | 11/2011 | Meyer et al. |
| 2011/0273475 A1 | 11/2011 | Herz et al. |
| 2011/0290686 A1 | 12/2011 | Huang |
| 2011/0295697 A1 | 12/2011 | Boston et al. |
| 2011/0297566 A1 | 12/2011 | Gallagher et al. |
| 2011/0298919 A1 | 12/2011 | Maglaque |
| 2011/0302518 A1 | 12/2011 | Zhang |
| 2011/0304577 A1 | 12/2011 | Brown |
| 2011/0305875 A1 | 12/2011 | Sanford et al. |
| 2011/0310038 A1 | 12/2011 | Park et al. |
| 2011/0316807 A1 | 12/2011 | Corrion |
| 2011/0320204 A1 | 12/2011 | Locker et al. |
| 2012/0002820 A1 | 1/2012 | Leichter |
| 2012/0007821 A1 | 1/2012 | Zaliva |
| 2012/0011462 A1 | 1/2012 | Westerman et al. |
| 2012/0020490 A1 | 1/2012 | Leichter |
| 2012/0023401 A1 | 1/2012 | Arscott et al. |
| 2012/0023459 A1 | 1/2012 | Westerman |
| 2012/0024682 A1 | 2/2012 | Huang et al. |
| 2012/0026096 A1 | 2/2012 | Ku |
| 2012/0032887 A1 | 2/2012 | Chiu et al. |
| 2012/0032891 A1 | 2/2012 | Parivar |
| 2012/0038495 A1 | 2/2012 | Ishikawa |
| 2012/0044179 A1 | 2/2012 | Hudson |

(56) References Cited

U.S. PATENT DOCUMENTS

| | | | |
|---|---|---|---|
| 2012/0047368 A1 | 2/2012 | Chinn et al. |
| 2012/0050975 A1 | 3/2012 | Garelli et al. |
| 2012/0062564 A1 | 3/2012 | Miyashita |
| 2012/0068919 A1 | 3/2012 | Lauder et al. |
| 2012/0069540 A1 | 3/2012 | Lauder et al. |
| 2012/0075249 A1 | 3/2012 | Hoch |
| 2012/0077384 A1 | 3/2012 | Bar-Niv et al. |
| 2012/0081316 A1 | 4/2012 | Sirpal et al. |
| 2012/0092279 A1 | 4/2012 | Martin |
| 2012/0094257 A1 | 4/2012 | Pillischer et al. |
| 2012/0099749 A1 | 4/2012 | Rubin et al. |
| 2012/0113137 A1 | 5/2012 | Nomoto |
| 2012/0113579 A1 | 5/2012 | Agata et al. |
| 2012/0117409 A1 | 5/2012 | Lee et al. |
| 2012/0127118 A1 | 5/2012 | Nolting et al. |
| 2012/0127126 A1 | 5/2012 | Mattice et al. |
| 2012/0139727 A1 | 6/2012 | Houvener et al. |
| 2012/0140396 A1 | 6/2012 | Zeliff et al. |
| 2012/0145525 A1 | 6/2012 | Ishikawa |
| 2012/0162693 A1 | 6/2012 | Ito |
| 2012/0175487 A1 | 7/2012 | Goto |
| 2012/0182242 A1 | 7/2012 | Lindahl et al. |
| 2012/0182249 A1* | 7/2012 | Endo et al. ................ 345/173 |
| 2012/0194448 A1 | 8/2012 | Rothkopf |
| 2012/0212438 A1 | 8/2012 | Vaisanen |
| 2012/0218194 A1 | 8/2012 | Silverman |
| 2012/0221877 A1 | 8/2012 | Prabu |
| 2012/0224073 A1 | 9/2012 | Miyahara |
| 2012/0227259 A1 | 9/2012 | Badaye et al. |
| 2012/0229634 A1 | 9/2012 | Laett et al. |
| 2012/0242584 A1 | 9/2012 | Tuli |
| 2012/0246377 A1 | 9/2012 | Bhesania |
| 2012/0249443 A1 | 10/2012 | Anderson et al. |
| 2012/0250873 A1 | 10/2012 | Bakalos et al. |
| 2012/0256959 A1 | 10/2012 | Ye et al. |
| 2012/0260177 A1 | 10/2012 | Sehrer |
| 2012/0274811 A1 | 11/2012 | Bakin |
| 2012/0298491 A1 | 11/2012 | Ozias et al. |
| 2012/0299872 A1 | 11/2012 | Nishikawa et al. |
| 2012/0300275 A1 | 11/2012 | Vilardell et al. |
| 2012/0312955 A1 | 12/2012 | Randolph |
| 2013/0009413 A1 | 1/2013 | Chiu, Jr. et al. |
| 2013/0015311 A1 | 1/2013 | Kim |
| 2013/0021289 A1 | 1/2013 | Chen et al. |
| 2013/0027867 A1 | 1/2013 | Lauder et al. |
| 2013/0031353 A1 | 1/2013 | Noro |
| 2013/0044059 A1 | 2/2013 | Fu |
| 2013/0044074 A1 | 2/2013 | Park et al. |
| 2013/0046397 A1 | 2/2013 | Fadell et al. |
| 2013/0063873 A1 | 3/2013 | Wodrich et al. |
| 2013/0067126 A1 | 3/2013 | Casparian et al. |
| 2013/0069916 A1 | 3/2013 | Estève |
| 2013/0073877 A1 | 3/2013 | Radke |
| 2013/0076617 A1 | 3/2013 | Csaszar et al. |
| 2013/0076635 A1 | 3/2013 | Lin |
| 2013/0082824 A1 | 4/2013 | Colley |
| 2013/0082950 A1 | 4/2013 | Lim et al. |
| 2013/0088431 A1 | 4/2013 | Ballagas et al. |
| 2013/0100082 A1 | 4/2013 | Bakin et al. |
| 2013/0106766 A1 | 5/2013 | Yilmaz et al. |
| 2013/0135214 A1 | 5/2013 | Li et al. |
| 2013/0159749 A1 | 6/2013 | Moeglein et al. |
| 2013/0162554 A1 | 6/2013 | Lauder et al. |
| 2013/0172906 A1 | 7/2013 | Olson et al. |
| 2013/0191741 A1 | 7/2013 | Dickinson et al. |
| 2013/0212483 A1 | 8/2013 | Brakensiek et al. |
| 2013/0217451 A1 | 8/2013 | Komiyama et al. |
| 2013/0226794 A1 | 8/2013 | Englebardt |
| 2013/0227836 A1 | 9/2013 | Whitt, III |
| 2013/0228023 A1 | 9/2013 | Drasnin |
| 2013/0228434 A1 | 9/2013 | Whitt, III |
| 2013/0228439 A1 | 9/2013 | Whitt, III |
| 2013/0229100 A1 | 9/2013 | Siddiqui |
| 2013/0229335 A1 | 9/2013 | Whitman |
| 2013/0229347 A1 | 9/2013 | Lutz, III |
| 2013/0229350 A1 | 9/2013 | Shaw |
| 2013/0229351 A1 | 9/2013 | Whitt, III |
| 2013/0229354 A1 | 9/2013 | Whitt, III et al. |
| 2013/0229363 A1 | 9/2013 | Whitman |
| 2013/0229366 A1 | 9/2013 | Dighde |
| 2013/0229380 A1 | 9/2013 | Lutz, III |
| 2013/0229386 A1 | 9/2013 | Bathiche |
| 2013/0229534 A1 | 9/2013 | Panay |
| 2013/0229568 A1 | 9/2013 | Belesiu |
| 2013/0229570 A1 | 9/2013 | Beck et al. |
| 2013/0229756 A1 | 9/2013 | Whitt, III |
| 2013/0229757 A1 | 9/2013 | Whitt, III et al. |
| 2013/0229758 A1 | 9/2013 | Belesiu |
| 2013/0229759 A1 | 9/2013 | Whitt, III |
| 2013/0229760 A1 | 9/2013 | Whitt, III |
| 2013/0229761 A1 | 9/2013 | Shaw |
| 2013/0229762 A1 | 9/2013 | Whitt, III |
| 2013/0229773 A1 | 9/2013 | Siddiqui |
| 2013/0230346 A1 | 9/2013 | Shaw |
| 2013/0231755 A1 | 9/2013 | Perek |
| 2013/0232280 A1 | 9/2013 | Perek |
| 2013/0232348 A1 | 9/2013 | Oler |
| 2013/0232349 A1 | 9/2013 | Oler |
| 2013/0232350 A1 | 9/2013 | Belesiu et al. |
| 2013/0232353 A1 | 9/2013 | Belesiu |
| 2013/0232571 A1 | 9/2013 | Belesiu |
| 2013/0232742 A1 | 9/2013 | Burnett et al. |
| 2013/0241860 A1 | 9/2013 | Ciesla et al. |
| 2013/0242495 A1 | 9/2013 | Bathiche et al. |
| 2013/0262886 A1 | 10/2013 | Nishimura |
| 2013/0300590 A1 | 11/2013 | Dietz |
| 2013/0300647 A1 | 11/2013 | Drasnin |
| 2013/0301199 A1 | 11/2013 | Whitt |
| 2013/0301206 A1 | 11/2013 | Whitt |
| 2013/0304941 A1 | 11/2013 | Drasnin |
| 2013/0321992 A1 | 12/2013 | Liu et al. |
| 2013/0322000 A1 | 12/2013 | Whitt |
| 2013/0322001 A1 | 12/2013 | Whitt |
| 2013/0329360 A1 | 12/2013 | Aldana |
| 2013/0332628 A1 | 12/2013 | Panay |
| 2013/0339757 A1 | 12/2013 | Reddy |
| 2013/0342465 A1 | 12/2013 | Bathiche |
| 2013/0342976 A1 | 12/2013 | Chung |
| 2014/0012401 A1 | 1/2014 | Perek |
| 2014/0043275 A1 | 2/2014 | Whitman |
| 2014/0048399 A1 | 2/2014 | Whitt, III |
| 2014/0085814 A1 | 3/2014 | Kielland |
| 2014/0118241 A1 | 5/2014 | Chai |
| 2014/0119802 A1 | 5/2014 | Shaw |
| 2014/0166227 A1 | 6/2014 | Bornemann |
| 2014/0167585 A1 | 6/2014 | Kuan et al. |
| 2014/0185215 A1 | 7/2014 | Whitt |
| 2014/0185220 A1 | 7/2014 | Whitt |
| 2014/0204514 A1 | 7/2014 | Whitt |
| 2014/0204515 A1 | 7/2014 | Whitt |
| 2014/0247546 A1 | 9/2014 | Whitt |
| 2014/0291134 A1 | 10/2014 | Whitt |
| 2014/0293534 A1 | 10/2014 | Siddiqui |
| 2014/0362506 A1 | 12/2014 | Whitt, III et al. |
| 2014/0372914 A1 | 12/2014 | Byrd et al. |
| 2014/0374230 A1 | 12/2014 | Shaw et al. |
| 2014/0379942 A1 | 12/2014 | Perek et al. |
| 2015/0005953 A1 | 1/2015 | Fadell et al. |
| 2015/0036274 A1 | 2/2015 | Belesiu et al. |

FOREIGN PATENT DOCUMENTS

| | | |
|---|---|---|
| CN | 101452334 | 6/2009 |
| CN | 101675406 | 3/2010 |
| CN | 101681189 | 3/2010 |
| CN | 102147643 | 8/2011 |
| CN | 103455149 | 12/2013 |
| EP | 1003188 | 5/2000 |
| EP | 1223722 | 7/2002 |
| EP | 1480029 | 11/2004 |
| EP | 1591891 | 11/2005 |
| EP | 2026178 | 2/2009 |
| EP | 2353978 | 8/2011 |
| GB | 2123213 | 1/1984 |

(56) References Cited

FOREIGN PATENT DOCUMENTS

| | | |
|---|---|---|
| JP | 52107722 | 9/1977 |
| JP | 56108127 | 8/1981 |
| JP | 10326124 | 12/1998 |
| JP | 1173239 | 3/1999 |
| JP | 11338575 | 12/1999 |
| JP | 2000010654 | 1/2000 |
| JP | 2001142564 | 5/2001 |
| JP | 2004038950 | 2/2004 |
| JP | 2006163459 | 6/2006 |
| JP | 2006294361 | 10/2006 |
| JP | 2010244514 | 10/2010 |
| KR | 20010107055 | 12/2001 |
| KR | 20050014299 | 2/2005 |
| KR | 20060003093 | 1/2006 |
| KR | 20080006404 | 1/2008 |
| KR | 20090029411 | 3/2009 |
| KR | 20100022059 | 2/2010 |
| KR | 20100067366 | 6/2010 |
| KR | 20100115675 | 10/2010 |
| KR | 1020110087178 | 8/2011 |
| KR | 20110109791 | 10/2011 |
| KR | 20110120002 | 11/2011 |
| KR | 20110122333 | 11/2011 |
| KR | 101113530 | 2/2012 |
| WO | WO-9919995 | 4/1999 |
| WO | WO 2006044818 | 4/2006 |
| WO | WO-2007112172 | 10/2007 |
| WO | WO-2009034484 | 3/2009 |
| WO | WO-2011049609 | 4/2011 |
| WO | WO-2014209818 | 12/2014 |

OTHER PUBLICATIONS

"Non-Final Office Action", U.S. Appl. No. 13/471,001, (Feb. 19, 2013), 15 pages.
"Non-Final Office Action", U.S. Appl. No. 13/471,139, (Mar. 21, 2013), 12 pages.
"Non-Final Office Action", U.S. Appl. No. 13/471,202, (Feb. 11, 2013), 10 pages.
"Non-Final Office Action", U.S. Appl. No. 13/471,336, (Jan. 18, 2013), 14 pages.
"Non-Final Office Action", U.S. Appl. No. 13/651,195, (Jan. 2, 2013), 14 pages.
"Non-Final Office Action", U.S. Appl. No. 13/651,232, (Jan. 17, 2013), 15 pages.
"Non-Final Office Action", U.S. Appl. No. 13/651,272, (Feb. 12, 2013), 10 pages.
"Non-Final Office Action", U.S. Appl. No. 13/651,287, (Jan. 29, 2013), 13 pages.
"Non-Final Office Action", U.S. Appl. No. 13/651,304, (Mar. 22, 2013), 9 pages.
"Non-Final Office Action", U.S. Appl. No. 13/651,327, (Mar. 22, 2013), 6 pages.
"Non-Final Office Action", U.S. Appl. No. 13/651,871, (Mar. 18, 2013), 14 pages.
"Non-Final Office Action", U.S. Appl. No. 13/651,976, (Feb. 22, 2013), 16 pages.
"Non-Final Office Action", U.S. Appl. No. 13/653,321, (Feb. 1, 2013), 13 pages.
"Non-Final Office Action", U.S. Appl. No. 13/653,682, (Feb. 7, 2013), 11 pages.
"Notice of Allowance", U.S. Appl. No. 13/470,633, (Mar. 22, 2013), 7 pages.
"Restriction Requirement", U.S. Appl. No. 13/471,139, (Jan. 17, 2013), 7 pages.
"Restriction Requirement", U.S. Appl. No. 13/651,304, (Jan. 18, 2013), 7 pages.
"Restriction Requirement", U.S. Appl. No. 13/651,726, (Feb. 22, 2013), 6 pages.
"Restriction Requirement", U.S. Appl. No. 13/651,871, (Feb. 7, 2013), 6 pages.

"The Microsoft Surface Tablets Comes With Impressive Design and Specs", Retrieved from <http://microsofttabletreview.com/the-microsoft-surface-tablets-comes-with-impressive-design-and-specs> on Jan. 30, 2013, (Jun. 2012), 2 pages.
"Tilt Shift Lenses: Perspective Control", retrieved from http://www.cambridgeincolour.com/tutorials/tilt-shift-lenses1.htm, (Mar. 28, 2008), 11 Pages.
"What is Active Alignment?", http://www.kasalis.com/active_alignment.html, retrieved on Nov. 22, 2012, 2 Pages.
"Accessing Device Sensors", retrieved from <https://developer.palm.com/content/api/dev-guide/pdk/accessing-device-sensors.html> on May 25, 2012, 4 pages.
"First One Handed Fabric Keyboard with Bluetooth Wireless Technology", Retrieved from: <http://press.xtvworld.com/article3817.html> on May 8, 2012, (Jan. 6, 2005), 2 pages.
"Force and Position Sensing Resistors: An Emerging Technology", *Interlink Electronics*, Available at <http://staff.science.uva.nl/~vlaander/docu/FSR/An_Exploring_Technology.pdf>, (Feb. 1990), pp. 1-6.
"Frogpad Introduces Wearable Fabric Keyboard with Bluetooth Technology", Retrieved from: <http://www.geekzone.co.nz/content.asp?contentid=3898> on May 7, 2012, (Jan. 7, 2005), 3 pages.
"Incipio LG G-Slate Premium Kickstand Case—Black Nylon", Retrieved from: <http://www.amazon.com/Incipio-G-Slate-Premium-Kickstand-Case/dp/B004ZKP916> on May 8, 2012, 4 pages.
"Membrane Keyboards & Membrane Keypads", Retrieved from: <http://www.pannam.com/> on May 9, 2012, (Mar. 4, 2009), 2 pages.
"Motion Sensors", *Android Developers*, retrieved from <http://developer.android.com/guide/topics/sensors/sensors_motion.html> on May 25, 2012, 7 pages.
"Position Sensors", *Android Developers*, retrieved from <http://developer.android.com/guide/topics/sensors/sensors_position.html> on May 25, 2012, 5 pages.
"SoIRxTM E-Series Multidirectional Phototherapy ExpandableTM 2-Bulb Full Body Panel System", Retrieved from: <http://www.solarcsystems.com/us_multidirectional_uv_light_therapy_1_intro.html > on Jul. 25, 2012, (2011), 4 pages.
"Virtualization Getting Started Guide", *Red Hat Enterprise Linux 6, Edition 0.2*, retrieved from <http://docs.redhat.com/docs/en-US/Red_Hat_Enterprise_Linux/6/html-single/Virtualization_Getting_Started_Guide/index.html> on Jun. 13, 2012, 24 pages.
Block, Steve et al., "DeviceOrientation Event Specification", *W3C, Editors Draft*, retrieved from <https://developer.palm.com/content/api/dev-guide/pdk/accessing-device-sensors.html> on May 25, 2012,(Jul. 12, 2011), 14 pages.
Brown, Rich "Microsoft Shows Off Pressure-Sensitive Keyboard", retrieved from <http://news.cnet.com/8301-17938_105-10304792-1.html> on May 7, 2012, (Aug. 6, 2009), 2 pages.
Butler, Alex et al., "SideSight: Multi-"touch" Interaction around Small Devices", *In the proceedings of the 21st annual ACM symposium on User interface software and technology.*, retrieved from <http://research.microsoft.com/pubs/132534/sidesight_crv3.pdf> on May 29, 2012, (Oct. 19, 2008), 4 pages.
Crider, Michael "Sony Slate Concept Tablet "Grows" a Kickstand", Retrieved from: <http://androidcommunity.com/sony-slate-concept-tablet-grows-a-kickstand-20120116/> on May 4, 2012, (Jan. 16, 2012), 9 pages.
Dietz, Paul H., et al., "A Practical Pressure Sensitive Computer Keyboard", In Proceedings of UIST 2009, (Oct. 2009), 4 pages.
Glatt, Jeff "Channel and Key Pressure (Aftertouch).", Retrieved from: <http://home.roadrunner.com/~jgglatt/tutr/touch.htm> on Jun. 11, 2012, 2 pages.
Hanlon, Mike "ElekTex Smart Fabric Keyboard Goes Wireless", Retrieved from: <http://www.gizmag.com/go/5048/ > on May 7, 2012, (Jan. 15, 2006), 5 pages.
Kaur, Sukhmani "Vincent Liew's redesigned laptop satisfies ergonomic needs", Retrieved from: <http://www.designbuzz.com/entry/vincent-liew-s-redesigned-laptop-satisfies-ergonomic-needs/> on Jul. 27, 2012, (Jun. 21, 2010), 4 pages.

(56) References Cited

OTHER PUBLICATIONS

Khuntontong, Puttachat et al., "Fabrication of Molded Interconnection Devices by Ultrasonic Hot Embossing on Thin Polymer Films", IEEE Transactions on Electronics Packaging Manufacturing, vol. 32, No. 3, (Jul. 2009), pp. 152-156.
Linderholm, Owen "Logitech Shows Cloth Keyboard for PDAs", Retrieved from: <http://www.pcworld.com/article/89084/logitech_shows_cloth_keyboard_for_pdas.html> on May 7, 2012, (Mar. 15, 2002), 5 pages.
McLellan, Charles "Eleksen Wireless Fabric Keyboard: a first look", Retrieved from: <http://www.zdnetasia.com/eleksen-wireless-fabric-keyboard-a-first-look-40278954.htm> on May 7, 2012, (Jul. 17, 2006), 9 pages.
Post, E.R. et al., "E-Broidery: Design and Fabrication of Textile-Based Computing", IBM Systems Journal, vol. 39, Issue 3 & 4, (Jul. 2000), pp. 840-860.
Purcher, Jack "Apple is Paving the Way for a New 3D GUI for IOS Devices", Retrieved from: <http://www.patentlyapple.com/patently-apple/2012/01/apple-is-paving-the-way-for-a-new-3d-gui-for-ios-devices.html> on Jun. 4, 2012, (Jan. 12, 2012), 15 pages.
Takamatsu, Seiichi et al., "Flexible Fabric Keyboard with Conductive Polymer-Coated Fibers", In Proceedings of Sensors 2011, (Oct. 28, 2011), 4 pages.
Zhang, et al., "Model-Based Development of Dynamically Adaptive Software", *In Proceedings of ICSE 2006*, Available at <http://www.irisa.fr/lande/lande/icse-proceedings/icse/p371.pdf>, (May 20, 2006), pp. 371-380.
"Corrected Notice of Allowance", U.S. Appl. No. 13/470,633, (Jul. 2, 2013), 2 pages.
"Final Office Action", U.S. Appl. No. 13/471,001, (Jul. 25, 2013), 20 pages.
"Final Office Action", U.S. Appl. No. 13/651,976, (Jul. 25, 2013), 21 pages.
"Final Office Action", U.S. Appl. No. 13/653,321, (Aug. 2, 2013), 17 pages.
"Non-Final Office Action", U.S. Appl. No. 13/527,263, (Jul. 19, 2013), 5 pages.
"Non-Final Office Action", U.S. Appl. No. 13/563,435, (Jun. 14, 2013), 6 pages.
"Non-Final Office Action", U.S. Appl. No. 13/564,520, (Jun. 19, 2013), 8 pages.
"Non-Final Office Action", U.S. Appl. No. 13/565,124, (Jun. 17, 2013), 5 pages.
"Non-Final Office Action", U.S. Appl. No. 13/651,871, (Jul. 1, 2013), 5 pages.
"Non-Final Office Action", U.S. Appl. No. 13/653,682, (Jun. 3, 2013), 14 pages.
"Notice of Allowance", U.S. Appl. No. 13/651,195, (Jul. 8, 2013), 9 pages.
"Notice of Allowance", U.S. Appl. No. 13/651,304, (Jul. 1, 2013), 5 pages.
"Notice of Allowance", U.S. Appl. No. 13/651,327, (Jun. 11, 2013), 7 pages.
"Notice of Allowance", U.S. Appl. No. 13/651,726, (May 31, 2013), 5 pages.
"PCT Search Report and Written Opinion", Application No. PCT/US2013/029461, (Jun. 21, 2013), 11 pages.
"PCT Search Report and Written Opinion", Application No. PCT/US2013/028948, (Jun. 21, 2013), 11 pages.
"Advanced Configuration and Power Management Specification", *Intel Corporation, Microsoft Corporation, Toshiba Corp. Revision 1*, (Dec. 22, 1996), Intel Corporation, 364 pages.
"Corrected Notice of Allowance", U.S. Appl. No. 13/651,327 (Sep. 12, 2013), 2 pages.
"Corrected Notice of Allowance", U.S. Appl. No. 13/651,327, (Sep. 23, 2013), 2 pages.
"Corrected Notice of Allowance", U.S Appl. No. 13/651,726, (Sep. 17, 2013), 2 pages.
"Final Office Action", U.S. Appl. No. 13/471,139, (Sep. 16, 2013), 13 pages.
"Final Office Action", U.S. Appl. No. 13/471,336, (Aug. 28, 2013), 18 pages.
"Final Office Action", U.S. Appl. No. 13/653,682, (Oct. 18, 2013), 16 pages.
"Final Office Action", U.S. Appl. No. 13/656,055, (Oct. 23, 2013), 14 pages.
"Final Office Action", U.S. Appl. No. 13/938,930, (Nov. 8, 2013), 10 pages.
"Final Office Action", U.S. Appl. No. 13/939,002, (Nov. 8, 2013), 7 pages.
"International Search Report and Written Opinion", Application No. PCT/US2013/040968, (Sep. 5, 2013), 12 pages.
"International Search Report and Written Opinion", Application No. PCT/US2013/042550, (Sep. 24, 2013), 14 pages.
"Non-Final Office Action", U.S. Appl. No. 13/780,228, (Oct. 30, 2013), 12 pages.
"Non-Final Office Action", U.S. Appl. No. 13/938,930, (Aug. 29, 2013), 9 pages.
"Non-Final Office Action", U.S. Appl. No. 13/939,002, (Aug. 28, 2013), 6 pages.
"Non-Final Office Action", U.S. Appl. No. 13/939,032, (Aug. 29, 2013), 7 pages.
"Notice of Allowance", U.S. Appl. No. 13/563,435, (Nov. 12, 2013), 5 pages.
"Notice of Allowance", U.S. Appl. No. 13/651,871, (Oct. 2, 2013), 7 pages.
"Notice to Grant", CN Application No. 201320097089.9, (Sep. 29, 2013), 2 Pages.
"Notice to Grant", CN Application No. 201320097124.7, (Oct. 8, 2013), 2 pages.
"Welcome to Windows 7", Retrieved from: <http://www.microsoft.com/en-us/download/confirmation.aspx?id=4984> on Aug. 1, 2013, (Sep. 16, 2009), 3 pages.
Prospero, Michael "Samsung Outs Series 5 Hybrid PC Tablet", Retrieved from: <http://blog.laptopmag.com/samsung-outs-series-5-hybrid-pc-tablet-running-windows-8> on Oct. 31, 2013, (Jun. 4, 2012), 7 pages.
"ACPI Docking for Windows Operating Systems", Retrieved from: <http://www.scritube.com/limba/engleza/software/ACPI-Docking-for-Windows-Opera331824193.php> on Jun. 6, 2012, 10 pages.
"Corrected Notice of Allowance", U.S. Appl. No. 13/470,633, (Apr. 9, 2013), 2 pages.
"DR2PA", retrieved from <http://www.architainment.co.uk/wp-content/uploads/2012/08/DR2PA-AU-US-size-Data-Sheet-Rev-H_LOGO.pdf> on Sep. 17, 2012, 4 pages.
"Final Office Action", U.S. Appl. No. 13/651,195, (Apr. 18, 2013), 13 pages.
"Final Office Action", U.S. Appl. No. 13/651,232, (May 21, 2013), 21 pages.
"Final Office Action", U.S. Appl. No. 13/651,287, (May 3, 2013), 16 pages.
"How to Use the iPad's Onscreen Keyboard", Retrieved from <http://www.dummies.com/how-to/content/how-to-use-the-ipads-onscreen-keyboard.html> on Aug. 28, 2012, 3 pages.
"NI Releases New Maschine & Maschine Mikro", Retrieved from <http://www.djbooth.net/index/dj-equipment/entry/ni-releases-new-maschine-mikro/> on Sep. 17, 2012, 19 pages.
"Non-Final Office Action", U.S. Appl. No. 13/651,726, (Apr. 15, 2013), 6 pages.
"Non-Final Office Action", U.S. Appl. No. 13/656,055, (Apr. 23, 2013), 11 pages.
"Notice of Allowance", U.S. Appl. No. 13/471,202, (May 28, 2013), 9 pages.
"Notice of Allowance", U.S. Appl. No. 13/651,272, (May 2, 2013), 7 pages.
"On-Screen Keyboard for Windows 7, Vista, XP with Touchscreen", Retrieved from <www.comfort-software.com/on-screen-keyboard.html> on Aug. 28, 2012, (Feb. 2, 2011), 3 pages.
Das, Apurba et al., "Study of Heat Transfer through Multilayer Clothing Assemblies: A Theoretical Prediction", Retrieved from <http://www.autexrj.com/cms/zalaczone_pliki/5_013_11.pdf>, (Jun. 2011), 7 pages.

(56) References Cited

OTHER PUBLICATIONS

Iwase, Eiji "Multistep Sequential Batch Assembly of Three-Dimensional Ferromagnetic Microstructures with Elastic Hinges", Retrieved at <<http://ieeexplore.ieee.org/stamp/stamp.jsp?tp=&arnumber=1549861>> Proceedings: Journal of Microelectromechanical Systems, (Dec. 2005), 7 pages.

Piltch, Avram "ASUS Eee Pad Slider SL101 Review", Retrieved from <http://www.laptopmag.com/review/tablets/asus-eee-pad-slider-sl101.aspx>, (Sep. 22, 2011), 5 pages.

Valliath, G T., "Design of Hologram for Brightness Enhancement in Color LCDs", Retrieved from <http://www.loreti.it/Download/PDF/LCD/44_05.pdf> on Sep. 17, 2012, 5 pages.

Williams, Jim "A Fourth Generation of LCD Backlight Technology", Retrieved from <http://cds.linear.com/docs/Application%20Note/an65f.pdf>, (Nov. 1995), 124 pages.

"Corrected Notice of Allowance", U.S. Appl. No. 13/563,435, Mar. 20, 2014, 2 pages.

"Corrected Notice of Allowance", U.S. Appl. No. 13/565,124, Apr. 3, 2014, 4 pages.

"Corrected Notice of Allowance", U.S. Appl. No. 13/565,124, Mar. 10, 2014, 2 pages.

"Corrected Notice of Allowance", U.S. Appl. No. 13/565,124, Apr. 14, 2014, 2 pages.

"Corrected Notice of Allowance", U.S. Appl. No. 13/938,930, May 6, 2014, 2 pages.

"Corrected Notice of Allowance", U.S. Appl. No. 13/939,002, May 5, 2014, 2 pages.

"Final Office Action", U.S. Appl. No. 13/780,228, Mar. 28, 2014, 13 pages.

"Final Office Action", U.S. Appl. No. 14/063,912, Apr. 29, 2014, 10 pages.

"Final Office Action", U.S. Appl. No. 14/199,924, May 6, 2014, 5 pages.

"Foreign Office Action", CN Application No. 201320328022.1, Feb. 17, 2014, 4 Pages.

"Foreign Office Action", CN Application No. 201320328022.1, Oct. 18, 2013, 3 Pages.

"International Search Report and Written Opinion", Application No. PCT/US2013/067905, Apr. 15, 2014, 9 pages.

"Non-Final Office Action", U.S. Appl. No. 13/471,237, Mar. 24, 2014, 7 pages.

"Non-Final Office Action", U.S. Appl. No. 13/471,336, May 7, 2014, 17 pages.

"Non-Final Office Action", U.S. Appl. No. 13/471,376, Apr. 2, 2014, 17 pages.

"Non-Final Office Action", U.S. Appl. No. 13/492,232, Apr. 30, 2014, 9 pages.

"Non-Final Office Action", U.S. Appl. No. 13/527,263, Apr. 3, 2014, 6 pages.

"Non-Final Office Action", U.S. Appl. No. 14/199,924, Apr. 10, 2014, 6 pages.

"Non-Final Office Action", U.S. Appl. No. 14/200,595, Apr. 11, 2014, 4 pages.

"Notice of Allowance", U.S. Appl. No. 13/651,232, Apr. 25, 2014, 9 pages.

"Notice of Allowance", U.S. Appl. No. 13/651,287, May 2, 2014, 6 pages.

"Notice of Allowance", U.S. Appl. No. 13/939,032, Apr. 3, 2014, 4 pages.

"Supplemental Notice of Allowance", U.S. Appl. No. 13/653,321, Mar. 28, 2014, 4 pages.

"Non-Final Office Action", U.S. Appl. No. 14/063,912, Jan. 2, 2014, 10 pages.

"FingerWorks Installation and Operation Guide for the TouchStream ST and TouchStream LP", FingerWorks, Inc. Retrieved from <http://ec1.images-amazon.com/media/i3d/01/a/man-migrate/MANUAL000049862.pdf>, 2002, 14 pages.

"Non-Final Office Action", U.S. Appl. No. 13/651,232, Dec. 5, 2013, 15 pages.

"Non-Final Office Action", U.S. Appl. No. 13/468,918, Dec. 26, 2013, 18 pages.

"Corrected Notice of Allowance", U.S. Appl. No. 13/563,435, Jan. 14, 2014, 2 pages.

"Corrected Notice of Allowance", U.S. Appl. No. 13/563,435, Jan. 22, 2014, 2 pages.

"Notice of Allowance", U.S. Appl. No. 13/653,321, Dec. 18, 2013, 41 pages.

"Foreign Office Action", Chinese Application No. 201320097066.8, Oct. 24, 2013, 5 Pages.

"Non-Final Office Action", U.S. Appl. No. 13/939,002, Dec. 20, 2013, 5 pages.

"Final Office Action", U.S. Appl. No. 13/939,032, Dec. 20, 2013, 5 pages.

"Restriction Requirement", U.S. Appl. No. 13/468,918, Nov. 29, 2013, 6 pages.

"Notice of Allowance", U.S. Appl. No. 13/565,124, Dec. 24, 2013, 6 pages.

"Final Office Action", U.S. Appl. No. 13/564,520, Jan. 15, 2014, 7 pages.

"Advisory Action", U.S. Appl. No. 13/939,032, Feb. 24, 2014, 2 pages.

"Non-Final Office Action", U.S. Appl. No. 13/599,635, Feb. 25, 2014, 13 pages.

"Non-Final Office Action", U.S. Appl. No. 13/471,186, Feb. 27, 2014, 8 pages.

"Non-Final Office Action", U.S. Appl. No. 13/471,405, Feb. 20, 2014, 37 pages.

"Non-Final Office Action", U.S. Appl. No. 13/564,520, Feb. 14, 2014, 5 pages.

"Non-Final Office Action", U.S. Appl. No. 13/653,682, Feb. 26, 2014, 10 pages.

"Non-Final Office Action", U.S. Appl. No. 13/656,055, Mar. 12, 2014, 17 pages.

"Notice of Allowance", U.S. Appl. No. 13/471,139, Mar. 17, 2014, 4 pages.

"Notice of Allowance", U.S. Appl. No. 13/938,930, Feb. 20, 2014, 4 pages.

"Notice of Allowance", U.S. Appl. No. 13/939,002, Mar. 3, 2014, 4 pages.

"Advisory Action", U.S. Appl. No. 14/199,924, May 28, 2014, 2 pages.

"Corrected Notice of Allowance", U.S. Appl. No. 13/651,232, Jul. 31, 2014, 2 pages.

"Corrected Notice of Allowance", U.S. Appl. No. 13/651,287, Aug. 21, 2014, 2 pages.

"Corrected Notice of Allowance", U.S. Appl. No. 13/938,930, Jun. 6, 2014, 2 pages.

"Corrected Notice of Allowance", U.S. Appl. No. 13/939,002, May 22, 2014, 2 pages.

"Corrected Notice of Allowance", U.S. Appl. No. 13/939,002, Jun. 19, 2014, 2 pages.

"Corrected Notice of Allowance", U.S. Appl. No. 13/939,032, Jun. 26, 2014, 2 pages.

"Corrected Notice of Allowance", U.S. Appl. No. 13/939,032, Jul. 15, 2014, 2 pages.

"Corrected Notice of Allowance", U.S. Appl. No. 14/199,924, Aug. 29, 2014, 2 pages.

"Corrected Notice of Allowance", U.S. Appl. No. 14/199,924, Sep. 5, 2014, 2 pages.

"Corrected Notice of Allowance", U.S. Appl. No. 14/199,924, Sep. 19, 2014, 2 pages.

"Final Office Action", U.S. Appl. No. 13/471,376, Aug. 18, 2014, 24 pages.

"Final Office Action", U.S. Appl. No. 13/595,700, Aug. 15, 2014, 6 pages.

"Final Office Action", U.S. Appl. No. 13/599,635, Aug. 8, 2014, 16 pages.

"Final Office Action", U.S. Appl. No. 13/653,682, Jun. 11, 2014, 11 pages.

"Final Office Action", U.S. Appl. No. 13/656,055, Sep. 17, 2014, 10 pages.

(56) References Cited

OTHER PUBLICATIONS

"Foreign Notice of Allowance", CN Application No. 201320096755.7, Jan. 27, 2014, 2 pages.
"Foreign Notice of Allowance", CN Application No. 201320097065.3, Nov. 21, 2013, 2 pages.
"Foreign Office Action", CN Application No. 201320097065.3, Jun. 18, 2013, 2 pages.
"Foreign Office Action", CN Application No. 201320097079.5, Sep. 26, 2013, 4 pages.
"Interlink Electronics FSR (TM) Force Sensing Resistors (TM)", Retrieved at <<http://akizukidenshi.com/download/ds/ interlinkelec/94-00004+Rev+B%20FSR%20Integration%20Guide.pdf on Mar. 21, 2013, 36 pages.
"International Search Report and Written Opinion", Application No. PCT/US2014/031531, Jun. 20, 2014, 10 Pages.
"International Search Report and Written Opinion", Application No. PCT/US2013/028483, Jun. 24, 2014, 10 pages.
"International Search Report and Written Opinion", Application No. PCT/US2013/028484, Jun. 24, 2014, 10 pages.
"International Search Report and Written Opinion", Application No. PCT/US2013/028485, Jun. 25, 2014, 10 pages.
"International Search Report and Written Opinion", Application No. PCT/US2013/028769, Jun. 26, 2014, 10 pages.
"International Search Report and Written Opinion", Application No. PCT/US2013/028771, Jun. 19, 2014, 10 pages.
"International Search Report and Written Opinion", Application No. PCT/US2013/028486, Jun. 20, 2014, 10 pages.
"International Search Report and Written Opinion", Application No. PCT/US2013/041017, Jul. 17, 2014, 10 pages.
"International Search Report and Written Opinion", Application No. PCT/US2013/028489, Jun. 20, 2014, 11 pages.
"International Search Report and Written Opinion", Application No. PCT/US2013/028488, Jun. 24, 2014, 11 pages.
"International Search Report and Written Opinion", Application No. PCT/US2013/028767, Jun. 24, 2014, 11 pages.
"International Search Report and Written Opinion", Application No. PCT/US2013/028481, Jun. 19, 2014, 11 pages.
"International Search Report and Written Opinion", Application No. PCT/US2013/028490, Jun. 24, 2014, 11 pages.
"International Search Report and Written Opinion", Application No. PCT/US2013/028766, Jun. 26, 2014, 11 pages.
"International Search Report and Written Opinion", Application No. PCT/US2013/028772, Jun. 30, 2014, 11 pages.
"International Search Report and Written Opinion", Application No. PCT/US2013/028768, Jun. 24, 2014, 12 pages.
"International Search Report and Written Opinion", Application No. PCT/US2013/028482, Jun. 20, 2014, 13 pages.
"International Search Report and Written Opinion", Application No. PCT/US2013/028487, May 27, 2014, 9 pages.
"International Search Report and Written Opinion", Application No. PCT/US2013/028770, Jun. 26, 2014, 9 pages.
"Non-Final Office Action", U.S. Appl. No. 13/468,882, Jul. 9, 2014, 9 pages.
"Non-Final Office Action", U.S. Appl. No. 13/470,951, Jul. 2, 2014, 19 pages.
"Non-Final Office Action", U.S. Appl. No. 13/471,001, Jun. 17, 2014, 23 pages.
"Non-Final Office Action", U.S. Appl. No. 13/471,030, May 15, 2014, 10 pages.
"Non-Final Office Action", U.S. Appl. No. 13/471,054, Jun. 3, 2014, 15 pages.
"Non-Final Office Action", U.S. Appl. No. 13/471,282, Sep. 3, 2014, 13 pages.
"Non-Final Office Action", U.S. Appl. No. 13/471,412, Jul. 11, 2014, 22 pages.
"Non-Final Office Action", U.S. Appl. No. 13/564,520, Jun. 16, 2014, 5 pages.
"Non-Final Office Action", U.S. Appl. No. 13/595,700, Jun. 18, 2014, 8 pages.
"Non-Final Office Action", U.S. Appl. No. 13/651,976, Jun. 16, 2014, 23 pages.
"Non-Final Office Action", U.S. Appl. No. 13/780,228, Sep. 15, 2014, 18 pages.
"Non-Final Office Action", U.S. Appl. No. 14/063,912, Sep. 2, 2014, 11 pages.
"Non-Final Office Action", U.S. Appl. No. 14/225,250, Jun. 17, 2014, 5 pages.
"Non-Final Office Action", U.S. Appl. No. 14/225,276, Jun. 13, 2014, 6 pages.
"Non-Final Office Action", U.S. Appl. No. 14/277,240, Jun. 13, 2014, 6 pages.
"Notice of Allowance", U.S. Appl. No. 13/468,918, Jun. 17, 2014, 5 pages.
"Notice of Allowance", U.S. Appl. No. 13/471,030, Sep. 5, 2014, 6 pages.
"Notice of Allowance", U.S. Appl. No. 13/471,186, Jul. 3, 2014, 7 pages.
"Notice of Allowance", U.S. Appl. No. 13/471,237, May 12, 2014, 8 pages.
"Notice of Allowance", U.S. Appl. No. 13/471,405, Jun. 24, 2014, 9 pages.
"Notice of Allowance", U.S. Appl. No. 13/666,958, Aug. 29, 2014, 9 pages.
"Notice of Allowance", U.S. Appl. No. 14/018,286, May 23, 2014, 8 pages.
"Notice of Allowance", U.S. Appl. No. 14/199,924, Jun. 10, 2014, 4 pages.
"Notice of Allowance", U.S. Appl. No. 14/277,240, Sep. 16, 2014, 4 pages.
"Restriction Requirement", U.S. Appl. No. 13/595,700, May 28, 2014, 6 pages.
"Supplemental Notice of Allowance", U.S. Appl. No. 13/471,405, Aug. 29, 2014, 5 pages.
"Supplemental Notice of Allowance", U.S. Appl. No. 14/018,286, Jun. 11, 2014, 5 pages.
"Corrected Notice of Allowance", U.S. Appl. No. 14/277,240, Jan. 8, 2015, 2 pages.
"Final Office Action", U.S. Appl. No. 13/468,882, Feb. 12, 2015, 9 pages.
"Final Office Action", U.S. Appl. No. 13/470,951, Jan. 12, 2015, 20 pages.
"Final Office Action", U.S. Appl. No. 13/527,263, Jan. 27, 2015, 7 pages.
"Final Office Action", U.S. Appl. No. 14/063,912, Jan. 12, 2015, 12 pages.
"Final Office Action", U.S. Appl. No. 14/225,276, Dec. 17, 2014, 6 pages.
"First Examination Report", NZ Application No. 628690, Nov. 27, 2014, 2 pages.
"Foreign Office Action", CN Application No. 201320097079.5, Jul. 28, 2014, 4 pages.
"Non-Final Office Action", U.S. Appl. No. 13/471,030, Jan. 15, 2015, 7 pages.
"Non-Final Office Action", U.S. Appl. No. 13/492,232, Feb. 24, 2015, 12 pages.
"Non-Final Office Action", U.S. Appl. No. 13/564,520, Jan. 26, 2015, 6 pages.
"Non-Final Office Action", U.S. Appl. No. 13/599,635, Feb. 12, 2015, 16 pages.
"Non-Final Office Action", U.S. Appl. No. 14/059,280, Mar. 3, 2015, 18 pages.
"Non-Final Office Action", U.S. Appl. No. 14/147,252, Feb. 23, 2015, 11 pages.
"Notice of Allowance", U.S. Appl. No. 13/595,700, Jan. 21, 2015, 4 pages.
"Notice of Allowance", U.S. Appl. No. 13/651,976, Jan. 21, 2015, 10 pages.
"Notice of Allowance", U.S. Appl. No. 13/656,055, Mar. 4, 2015, 7 pages.
"Notice of Allowance", U.S. Appl. No. 14/200,595, Feb. 17, 2015, 2 pages.

(56) References Cited

OTHER PUBLICATIONS

"Notice of Allowance", U.S. Appl. No. 14/200,595, Feb. 25, 2015, 4 pages.
"Supplemental Notice of Allowance", U.S. Appl. No. 13/471,405, Dec. 17, 2014, 5 pages.
"Corrected Notice of Allowance", U.S. Appl. No. 13/471,030, Sep. 30, 2014, 2 pages.
"Final Office Action", U.S. Appl. No. 13/471,054, Oct. 23, 2014, 17 pages.
"Final Office Action", U.S. Appl. No. 13/471,336, Oct. 6, 2014, 13 pages.
"Final Office Action", U.S. Appl. No. 13/471,412, Dec. 15, 2014, 11 pages.
"Final Office Action", U.S. Appl. No. 13/492,232, Nov. 17, 2014, 13 pages.
"Final Office Action", U.S. Appl. No. 13/595,700, Oct. 9, 2014, 8 pages.
"Final Office Action", U.S. Appl. No. 14/200,595, Nov. 19, 2014, 5 pages.
"International Search Report and Written Opinion", Application No. PCT/US2014/043546, Oct. 9, 2014, 10 pages.
"Non-Final Office Action", U.S. Appl. No. 13/471,393, Oct. 20, 2014, 12 pages.
"Non-Final Office Action", U.S. Appl. No. 13/525,614, Nov. 24, 2014, 19 pages.
"Notice of Allowance", U.S. Appl. No. 13/653,682, Sep. 24, 2014, 4 pages.
"Restriction Requirement", U.S. Appl. No. 14/147,252, Dec. 1, 2014, 6 pages.
Harrison, "UIST 2009 Student Innovation Contest- Demo Video", Retrieved From: <https://www.youtube.com/watch?v=PDI8eYIASf0> Sep. 16, 2014, Jul. 23, 2009, 1 pages.
"Corrected Notice of Allowance", U.S. Appl. No. 13/651,232, Apr. 24, 2015, 2 pages.
"Corrected Notice of Allowance", U.S. Appl. No. 13/656,055, Apr. 13, 2015, 2 pages.
"Corrected Notice of Allowance", U.S. Appl. No. 13/715,229, Apr. 16, 2015, 2 pages.
"Corrected Notice of Allowance", U.S. Appl. No. 14/177,018, Mar. 2, 2015, 2 pages.
"Final Office Action", U.S. Appl. No. 13/655,065, Apr. 2, 2015, 23 pages.
"Final Office Action", U.S. Appl. No. 13/780,228, Apr. 10, 2015, 19 pages.
"Final Office Action", U.S. Appl. No. 14/225,250, Mar. 13, 2015, 7 pages.
"Foreign Notice on Reexamination", CN Application No. 201320097066.8, Apr. 3, 2015, 7 Pages.
"Non-Final Office Action", U.S. Appl. No. 13/471,054, Mar. 13, 2015, 18 pages.
"Non-Final Office Action", U.S. Appl. No. 13/471,376, Mar. 27, 2015, 28 pages.
"Non-Final Office Action", U.S. Appl. No. 13/471,393, Mar. 26, 2015, 13 pages.
"Non-Final Office Action", U.S. Appl. No. 13/653,218, Mar. 4, 2015, 16 pages.
"Non-Final Office Action", U.S. Appl. No. 13/852,848, Mar. 26, 2015, 7 pages.
"Non-Final Office Action", U.S. Appl. No. 13/926,944, Apr. 23, 2015, 6 pages.
"Non-Final Office Action", U.S. Appl. No. 13/975,087, Feb. 27, 2015, 20 pages.
"Non-Final Office Action", U.S. Appl. No. 14/225,276, Apr. 23, 2015, 7 pages.
"Notice of Allowance", U.S. Appl. No. 13/468,918, Apr. 8, 2015, 7 pages.
"Notice of Allowance", U.S. Appl. No. 13/471,030, Apr. 6, 2015, 6 pages.
"Notice of Allowance", U.S. Appl. No. 13/599,763, Feb. 18, 2015, 4 pages.
"Notice of Allowance", U.S. Appl. No. 13/651,232, Mar. 30, 2015, 7 pages.
"Notice of Allowance", U.S. Appl. No. 13/653,184, Mar. 10, 2015, 6 pages.
Schafer, "Using Interactive Maps for Navigation and Collaboration", CHI '01 Extended Abstracts on Human Factors in Computing Systems, Mar. 31, 2001, 2 pages.
"Corrected Notice of Allowance", U.S. Appl. No. 13/651,232, Jun. 10, 2015, 2 pages.
"Corrected Notice of Allowance", U.S. Appl. No. 13/651,232, Jul. 6, 2015, 2 pages.
"Corrected Notice of Allowance", U.S. Appl. No. 13/656,055, Jul. 1, 2015, 2 pages.
"Corrected Notice of Allowance", U.S. Appl. No. 14/200,595, Jun. 4, 2015, 3 pages.
"Final Office Action", U.S. Appl. No. 13/492,232, Jul. 10, 2015, 11 pages.
"Final Office Action", U.S. Appl. No. 13/525,614, Apr. 29, 2015, 20 pages.
"Final Office Action", U.S. Appl. No. 13/852,848, Jul. 20, 2015, 9 pages.
"Final Office Action", Application No. 14/059,280, Jul. 22, 2015, 25 pages.
"Final Office Action", U.S. Appl. No. 14/147,252, Jun. 25, 2015, 11 pages.
"Foreign Office Action", CN Application No. 201310067335.0, Jun. 12, 2015, 15 Pages.
"Foreign Office Action", CN Application No. 201310067808.7, May 28, 2015, 14 Pages.
"Foreign Office Action", CN Application No. 201310225788.1, Jun. 23, 2015, 14 Pages.
"International Preliminary Report on Patentability", Application No. PCT/US2014/031531, Jun. 9, 2015, 7 pages.
"Non-Final Office Action", U.S. Appl. No. 13/471,336, Jun. 24, 2015, 15 pages.
"Non-Final Office Action", U.S. Appl. No. 13/471,412, Jun. 1, 2015, 31 pages.
"Non-Final Office Action", U.S. Appl. No. 13/647,479, Apr. 28, 2015, 11 pages.
"Non-Final Office Action", U.S. Appl. No. 14/063,912, May 7, 2015, 12 pages.
"Non-Final Office Action", U.S. Appl. No. 14/727,001, Jul. 10, 2015, 7 pages.
"Notice of Allowance", U.S. Appl. No. 13/471,282, Apr. 30, 2015, 8 pages.
"Notice of Allowance", U.S. Appl. No. 13/564,520, May 8, 2015, 4 pages.
"Notice of Allowance", U.S. Appl. No. 14/225,276, Jun. 22, 2015, 4 pages.
"Notice of Allowance", U.S. Appl. No. 14/457,881, Jul. 22, 2015, 7 pages.
"Supplemental Notice of Allowance", U.S. Appl. No. 13/468,918, Jun. 4, 2015, 2 pages.
"Supplemental Notice of Allowance", U.S. Appl. No. 13/595,700, May 4, 2015, 2 pages.
"Supplemental Notice of Allowance", U.S. Appl. No. 13/595,700, May 22, 2015, 2 pages.
"Supplemental Notice of Allowance", U.S. Appl. No. 13/653,184, Jun. 24, 2015, 2 pages.
"Supplemental Notice of Allowance", U.S. Appl. No. 13/656,055, May 15, 2015, 2 pages.
"Supplemental Notice of Allowance", U.S. Appl. No. 13/656,055, Jun. 10, 2015, 2 pages.

\* cited by examiner

FORCE CONCENTRATOR

RELATED APPLICATIONS

This application claims priority under 35 U.S.C. §119(e) to the following U.S. Provisional Patent Applications, the entire disclosures of each of these applications being incorporated by reference in their entirety:

U.S. Provisional Patent Application No. 61/606,321, filed Mar. 2, 2012, and titled "Screen Edge;"

U.S. Provisional Patent Application No. 61/606,301, filed Mar. 2, 2012, and titled "Input Device Functionality;"

U.S. Provisional Patent Application No. 61/606,313, filed Mar. 2, 2012, and titled "Functional Hinge;"

U.S. Provisional Patent Application No. 61/606,333, filed Mar. 2, 2012, and titled "Usage and Authentication;"

U.S. Provisional Patent Application No. 61/613,745, filed Mar. 21, 2012, and titled "Usage and Authentication;"

U.S. Provisional Patent Application No. 61/606,336, filed Mar. 2, 2012, and titled "Kickstand and Camera;" and U.S. Provisional Patent Application No. 61/607,451, filed Mar. 6, 2012, and titled "Spanaway Provisional;" and further this application incorporates the following applications by reference in their entirety:

U.S. patent application Ser. No. 13/470,633, filed May 14, 2012, and titled "Flexible Hinge and Removable Attachment;"

U.S. patent application Ser. No. 13/471,186, filed May 14, 2012, and titled "Input Device Layers and Nesting."

BACKGROUND

Mobile computing devices have been developed to increase the functionality that is made available to users in a mobile setting. For example, a user may interact with a mobile phone, tablet computer, or other mobile computing device to check email, surf the web, compose texts, interact with applications, and so on. However, traditional mobile computing devices often employed a virtual keyboard that was accessed using touchscreen functionality of the device. This was generally employed to maximize an amount of display area of the computing device.

Use of the virtual keyboard, however, could be frustrating to a user that desired to provide a significant amount of inputs, such as to enter a significant amount of text to compose a long email, document, and so forth. Thus, conventional mobile computing devices were often perceived to have limited usefulness for such tasks, especially in comparison with ease at which users could enter text using a conventional keyboard, e.g., of a conventional desktop computer. Use of the conventional keyboards, though, with the mobile computing device could decrease the mobility of the mobile computing device and thus could make the mobile computing device less suited for its intended use in mobile settings.

SUMMARY

Force concentrator techniques are described. In one or more implementations, a pressure sensitive key includes a sensor substrate having a plurality of conductors, a flexible contact layer spaced apart from the sensor substrate and configured to flex to contact the sensor substrate to initiate an input; and a force concentrator layer disposed proximal to the flexible contact layer on a side opposite the sensor substrate. The force concentrator layer has a pad disposed thereon that is configured to cause pressure applied to the force concentrator layer to be channeled through the pad to cause the flexible contact layer to contact the sensor substrate to initiate the input.

In one or more implementations, a pressure sensitive key includes a sensor substrate having a plurality of conductors, a flexible contact layer spaced apart from the sensor substrate and configured to flex to contact the sensor substrate to initiate an input, and a force concentrator layer disposed proximal to the flexible contact layer on a side opposite the sensor substrate. The force concentrator layer is configured to act as a mechanical filter such that an amount of pressure below a threshold amount is not channeled in a sufficient amount to cause the flexible contact layer to contact the force concentrator layer in an amount that is sufficient to initiate the input.

In one or more implementations, a keyboard comprising a plurality of pressure sensitive keys formed to include a sensor substrate having a plurality of conductors, a flexible contact layer spaced apart from the sensor substrate and configured to flex to contact the sensor substrate to initiate an input of a respective said key, and a force concentrator layer disposed proximal to the flexible contact layer on a side opposite the sensor substrate. The force concentrator layer has a first side including a pad disposed thereon that is configured to contact the flexible contact layer pressure applied to the force concentrator layer to be channeled through the pad to cause the flexible contact layer to contact the sensor substrate to initiate the input of the respective said key and a second side that is substantially smooth. An outer material is disposed over the second side of the force concentrator layer, the outer material including indications of the input of the respective key.

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

BRIEF DESCRIPTION OF THE DRAWINGS

The detailed description is described with reference to the accompanying figures. In the figures, the left-most digit(s) of a reference number identifies the figure in which the reference number first appears. The use of the same reference numbers in different instances in the description and the figures may indicate similar or identical items. Entities represented in the figures may be indicative of one or more entities and thus reference may be made interchangeably to single or plural forms of the entities in the discussion.

DETAILED DESCRIPTION

Overview

Figure 1:
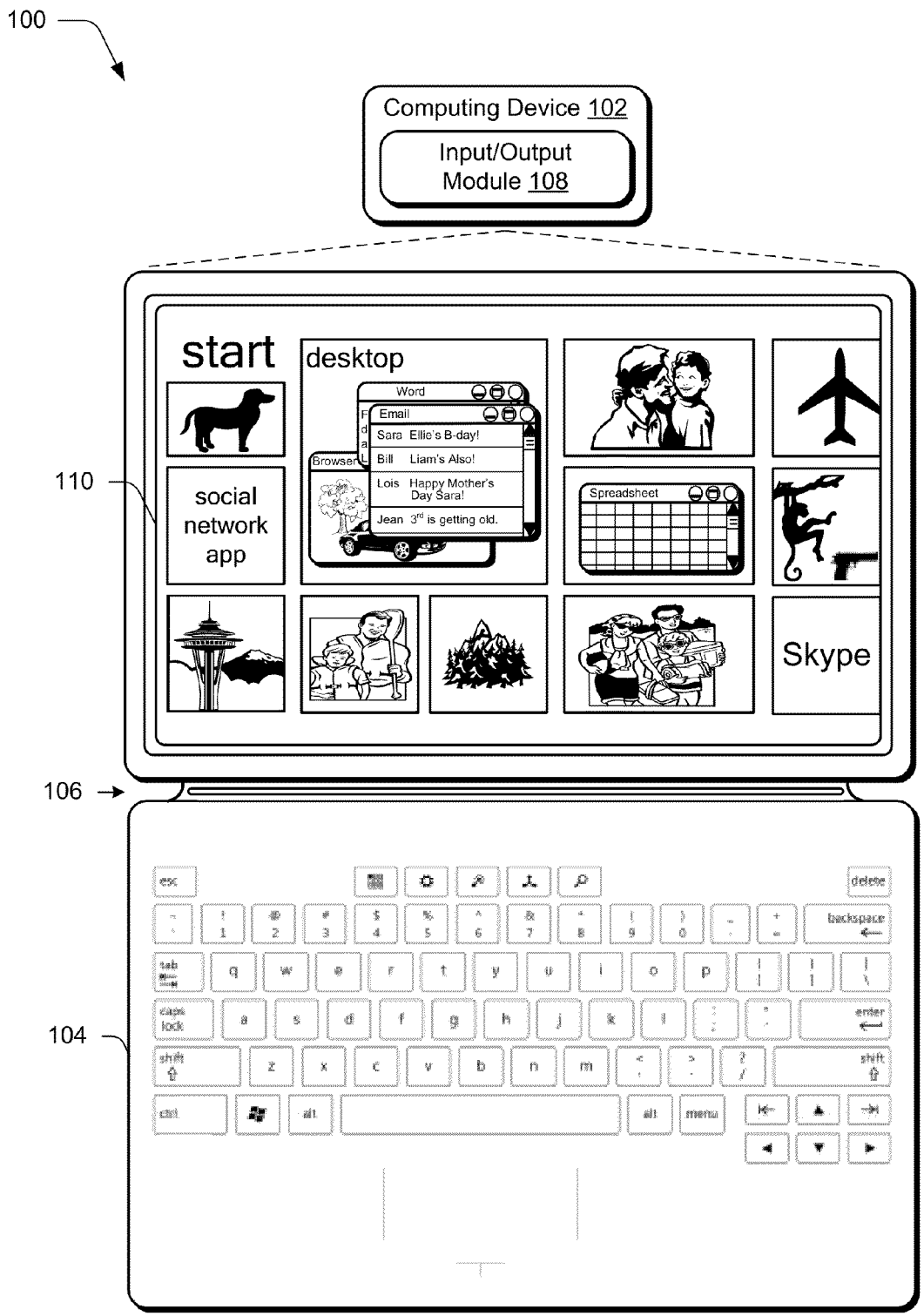
FIG. 1 is an illustration of an environment in an example implementation that is operable to employ the techniques described herein.

Pressure sensitive keys may be used as part of an input device to support a relatively thin form factor, such as approximately less than three and a half millimeters. However, pressure sensitive keys may not provide a degree of feedback that is common with conventional mechanical keyboards and therefore may result in missed hits and partial hits to intended keys of the keyboard. Further, conventional configuration of the pressure sensitive keys often resulted in different sensitivities due to the flexibility of the material being deflected, e.g., greater deflection is generally observed at a central area of the key as opposed to an edge of the key. Therefore, conventional pressure sensitive keys could result in an inconsistent user experience with a device that employs the keys.

Force concentrator layer techniques are described. In one or more implementations, a force concentrator layer is configured to improve consistency of contact made by a pressure sensitive key, e.g., to counteract differences in the flexibility at different positions of the pressure sensitive key. For example, the force concentrator layer may employ a series of pads. The pads may be configured to contact a flexible contact layer of the pressure sensitive key. This contact may cause a increase in a bend radius of the flexible contact layer due to an increase in mechanical stiffness provided by the pad. The increase in the bend radius may promote consistent contact of the flexible contact layer with a sensor substrate, even for pressures cause by relatively small surface areas, e.g., a fingernail of a user, stylus, pen, and so forth.

Additionally, the pads of the force concentrator layer may be configured to reduce "dead spots" between keys of a keyboard by channeling pressure through the pad to the flexible contact layer. Further, the force concentrator layer may also be configured to act as a mechanical filter. The force concentrator layer, for instance, may be configured so as to promote limited flexibility below a threshold. This threshold may be used to mechanically filter out relatively weak pressures, such as pressures encountered from the fingers of a user being rested on a keyboard. Thus, this mechanical filtering may reduce an amount of processing performed to determine whether a user intended to perform a key press or not. Yet further, the force concentrator layer may be configured to reduce witness lines viewable at an outer surface of a keyboard caused by underlying components of the keyboard. Further discussion of these and other features may be found in relation to the following sections.

In the following discussion, an example environment is first described that may employ the techniques described herein. Example procedures are then described which may be performed in the example environment as well as other environments. Consequently, performance of the example procedures is not limited to the example environment and the example environment is not limited to performance of the example procedures.

Example Environment

FIG. 1 is an illustration of an environment 100 in an example implementation that is operable to employ the techniques described herein. The illustrated environment 100 includes an example of a computing device 102 that is physically and communicatively coupled to an input device 104 via a flexible hinge 106. The computing device 102 may be configured in a variety of ways. For example, the computing device 102 may be configured for mobile use, such as a mobile phone, a tablet computer as illustrated, and so on. Thus, the computing device 102 may range from full resource devices with substantial memory and processor resources to a low-resource device with limited memory and/or processing resources. The computing device 102 may also relate to software that causes the computing device 102 to perform one or more operations.

The computing device 102, for instance, is illustrated as including an input/output module 108. The input/output module 108 is representative of functionality relating to processing of inputs and rendering outputs of the computing device 102. A variety of different inputs may be processed by the input/output module 108, such as inputs relating to functions that correspond to keys of the input device 104, keys of a virtual keyboard displayed by the display device 110 to identify gestures and cause operations to be performed that correspond to the gestures that may be recognized through the input device 104 and/or touchscreen functionality of the display device 110, and so forth. Thus, the input/output module 108 may support a variety of different input techniques by recognizing and leveraging a division between types of inputs including key presses, gestures, and so on.

In the illustrated example, the input device 104 is configured as a keyboard having a QWERTY arrangement of keys although other arrangements of keys are also contemplated. Further, other non-conventional configurations are also contemplated, such as a game controller, configuration to mimic a musical instrument, and so forth. Thus, the input device 104 and keys incorporated by the input device 104 may assume a variety of different configurations to support a variety of different functionality.

As previously described, the input device 104 is physically and communicatively coupled to the computing device 102 in this example through use of a flexible hinge 106. The flexible hinge 106 is flexible in that rotational movement supported by the hinge is achieved through flexing (e.g., bending) of the material forming the hinge as opposed to mechanical rotation as supported by a pin, although that embodiment is also contemplated. Further, this flexible rotation may be configured to support movement in one direction (e.g., vertically in the figure) yet restrict movement in other directions, such as lateral movement of the input device 104 in relation to the computing device 102. This may be used to support consistent alignment of the input device 104 in relation to the computing device 102, such as to align sensors used to change power states, application states, and so on.

The flexible hinge 106, for instance, may be formed using one or more layers of fabric and include conductors formed as flexible traces to communicatively couple the input device 104 to the computing device 102 and vice versa. This communication, for instance, may be used to communicate a result of a key press to the computing device 102, receive power from the computing device, perform authentication, provide supplemental power to the computing device 102, and so on. The flexible hinge 106 may be configured in a variety of ways, further discussion of which may be found in relation to the following figure.

Figure 2:
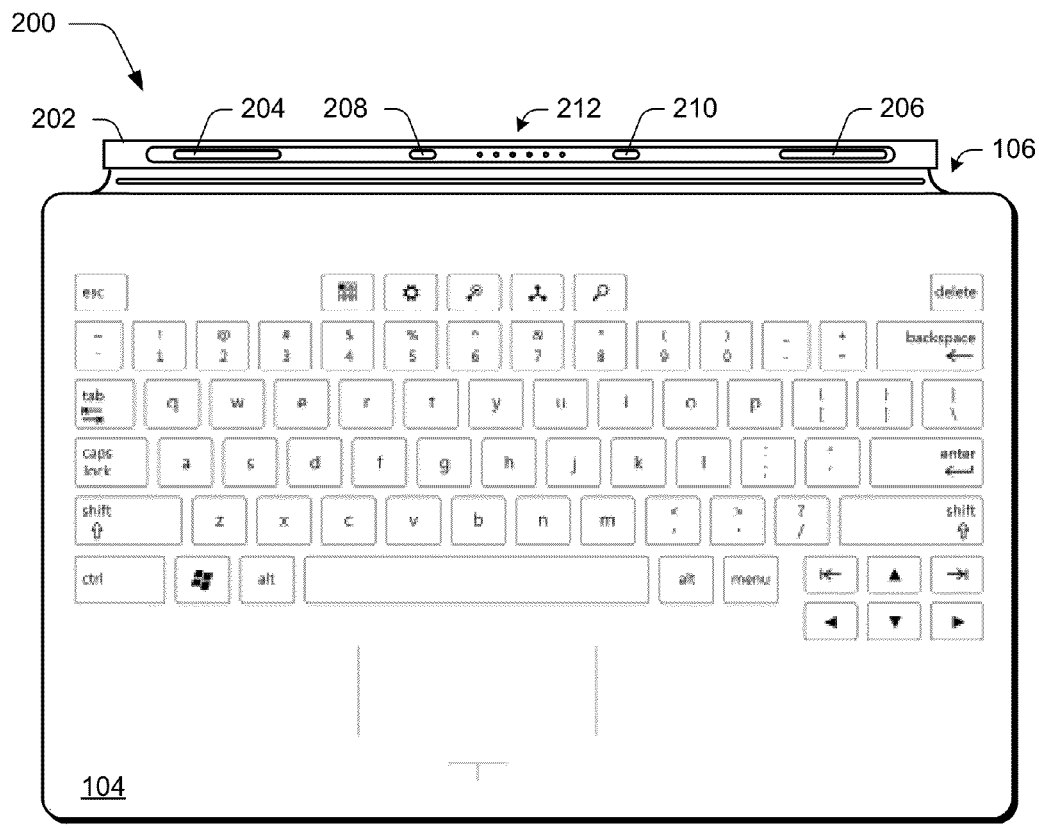
FIG. 2 depicts an example implementation of an input device of FIG. 1 as showing a flexible hinge in greater detail.

FIG. 2 depicts an example implementation 200 of the input device 104 of FIG. 1 as showing the flexible hinge 106 in greater detail. In this example, a connection portion 202 of the input device is shown that is configured to provide a communicative and physical connection between the input device 104 and the computing device 102. In this example, the connection portion 202 has a height and cross section configured to be received in a channel in the housing of the computing device 102, although this arrangement may also be reversed without departing from the spirit and scope thereof.

The connection portion 202 is flexibly connected to a portion of the input device 104 that includes the keys through use of the flexible hinge 106. Thus, when the connection portion 202 is physically connected to the computing device the combination of the connection portion 202 and the flexible hinge 106 supports movement of the input device 104 in relation to the computing device 102 that is similar to a hinge of a book.

For example, rotational movement may be supported by the flexible hinge 106 such that the input device 104 may be placed against the display device 110 of the computing device 102 and thereby act as a cover. The input device 104 may also be rotated so as to be disposed against a back of the computing device 102, e.g., against a rear housing of the computing device 102 that is disposed opposite the display device 110 on the computing device 102.

Naturally, a variety of other orientations are also supported. For instance, the computing device 102 and input device 104 may assume an arrangement such that both are laid flat against a surface as shown in FIG. 1. In another instance, a typing arrangement may be supported in which the input device 104 is laid flat against a surface and the computing device 102 is disposed at an angle to permit viewing of the display device 110, e.g., such as through use of a kickstand disposed on a rear surface of the computing device 102. Other instances are also contemplated, such as a tripod arrangement, meeting arrangement, presentation arrangement, and so forth.

The connecting portion 202 is illustrated in this example as including magnetic coupling devices 204, 206, mechanical coupling protrusions 208, 210, and a plurality of communication contacts 212. The magnetic coupling devices 204, 206 are configured to magnetically couple to complementary magnetic coupling devices of the computing device 102 through use of one or more magnets. In this way, the input device 104 may be physically secured to the computing device 102 through use of magnetic attraction.

The connecting portion 202 also includes mechanical coupling protrusions 208, 210 to form a mechanical physical connection between the input device 104 and the computing device 102. The mechanical coupling protrusions 208, 210 are shown in greater detail in the following figure.

Figure 3:
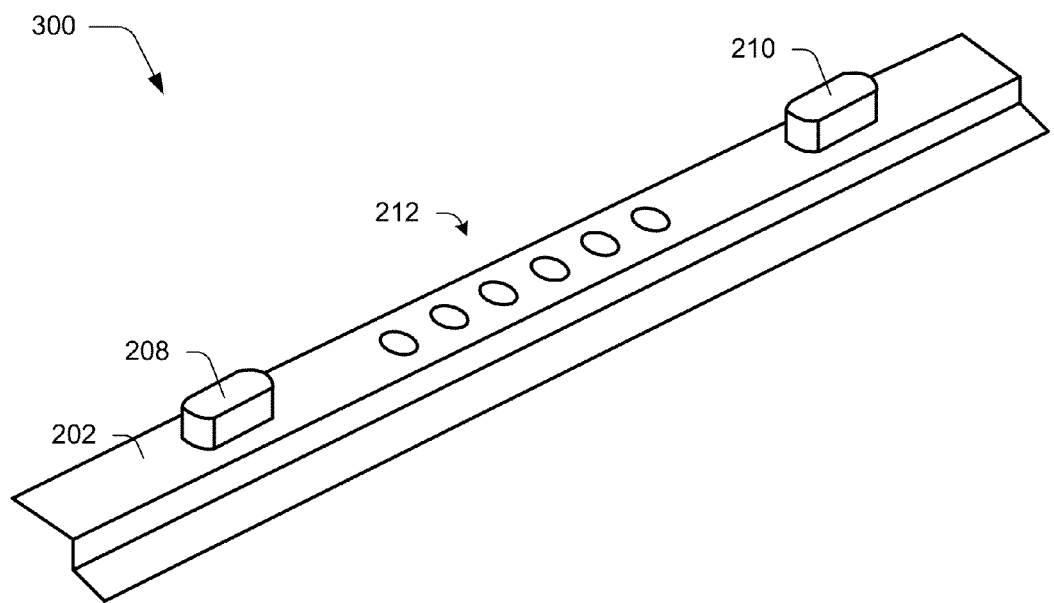
FIG. 3 depicts an example implementation showing a perspective view of a connecting portion of FIG. 2 that includes mechanical coupling protrusions and a plurality of communication contacts.

FIG. 3 depicts an example implementation 300 shown a perspective view of the connecting portion 202 of FIG. 2 that includes the mechanical coupling protrusions 208, 210 and the plurality of communication contacts 212. As illustrated, the mechanical coupling protrusions 208, 210 are configured to extend away from a surface of the connecting portion 202, which in this case is perpendicular although other angles are also contemplated.

The mechanical coupling protrusions 208, 210 are configured to be received within complimentary cavities within the channel of the computing device 102. When so received, the mechanical coupling protrusions 208, 210 promote a mechanical binding between the devices when forces are applied that are not aligned with an axis that is defined as correspond to the height of the protrusions and the depth of the cavity.

For example, when a force is applied that does coincide with the longitudinal axis described previously that follows the height of the protrusions and the depth of the cavities, a user overcomes the force applied by the magnets solely to separate the input device 104 from the computing device 102. However, at other angles the mechanical coupling protrusion 208, 210 are configured to mechanically bind within the cavities, thereby creating a force to resist removal of the input device 104 from the computing device 102 in addition to the magnetic force of the magnetic coupling devices 204, 206. In this way, the mechanical coupling protrusions 208, 210 may bias the removal of the input device 104 from the computing device 102 to mimic tearing a page from a book and restrict other attempts to separate the devices.

The connecting portion 202 is also illustrated as including a plurality of communication contacts 212. The plurality of communication contacts 212 is configured to contact corresponding communication contacts of the computing device 102 to form a communicative coupling between the devices. The communication contacts 212 may be configured in a variety of ways, such as through formation using a plurality of spring loaded pins that are configured to provide a consistent communication contact between the input device 104 and the computing device 102. Therefore, the communication contact may be configured to remain during minor movement of jostling of the devices. A variety of other examples are also contemplated, including placement of the pins on the computing device 102 and contacts on the input device 104.

Figure 4:
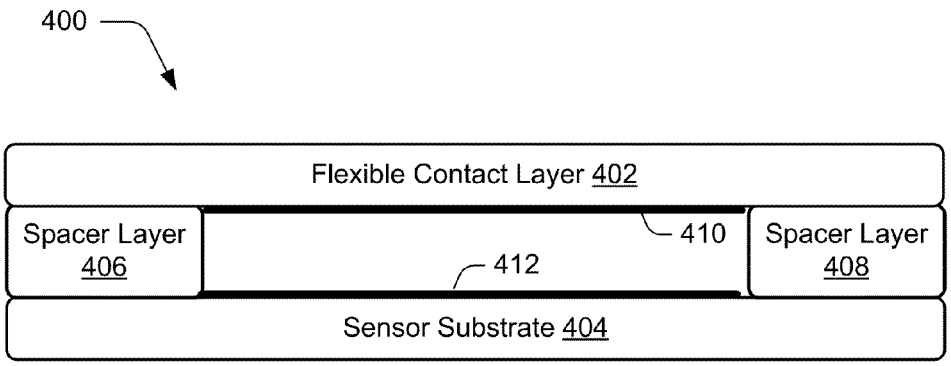
FIG. 4 depicts an example of a cross-sectional view of a pressure sensitive key of a keyboard of the input device of FIG. 2.

FIG. 4 depicts an example of a cross-sectional view of a pressure sensitive key 400 of a keyboard of the input device 104 of FIG. 2. The pressure sensitive key 400 in this example is illustrated as being formed using a flexible contact layer 402 (e.g., Mylar) that is spaced apart from the sensor substrate 404 using a spacer layer 406, 408, which may be formed as another layer of Mylar or other bendable material, formed on the sensor substrate 404, and so on. In this example, the flexible contact layer 402 does not contact the sensor substrate 404 absent application of pressure against the flexible contact layer 402.

The flexible contact layer 402 in this example includes a force sensitive ink 410 disposed on a surface of the flexible contact layer 402 that is configured to contact the sensor substrate 404. The force sensitive ink 410 is configured such that an amount of resistance of the ink varies directly in relation to an amount of pressure applied. The force sensitive ink 410, for instance, may be configured with a relatively rough surface that is compressed against the sensor substrate 404 upon an application of pressure against the flexible contact layer 402. The greater the amount of pressure, the more the force sensitive ink 410 is compressed, thereby increasing conductivity and decreasing resistance of the force sensitive ink 410. Other conductors may also be disposed on the flexible contact layer 402 without departing form the spirit and scope therefore, including other types of pressure sensitive and non-pressure sensitive conductors.

The sensor substrate 404 includes one or more conductors 412 disposed thereon that are configured to be contacted by the force sensitive ink 410 of the flexible contact layer 402. When contacted, an analog signal may be generated for processing by the input device 104 and/or the computing device 102, e.g., to recognize whether the signal is likely intended by a user to provide an input for the computing device 102. A variety of different types of conductors 412 may be disposed on the sensor substrate 404, such as formed from a variety of conductive materials (e.g., silver, copper), disposed in a variety of different configurations such as inter-digitated trace fingers, and so on.

Figure 5:
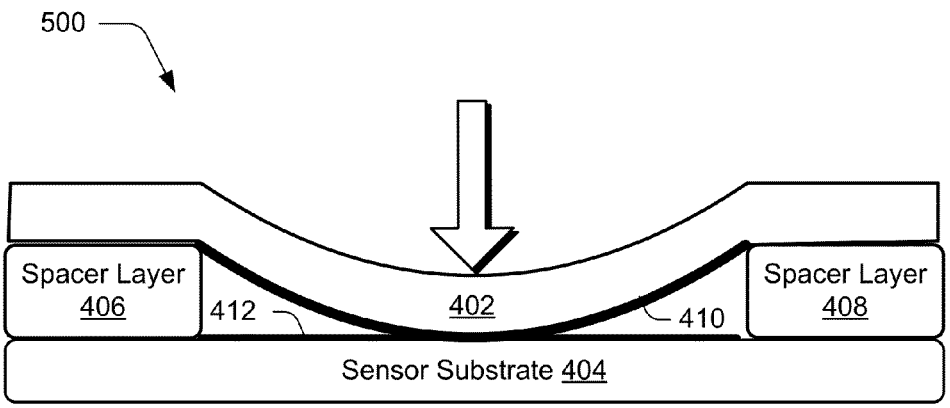
FIG. 5 depicts an example of a pressure sensitive key of FIG. 4 as having pressure applied at a first location of a flexible contact layer to cause contact with a corresponding first location of a sensor substrate.

FIG. 5 depicts an example 500 of the pressure sensitive key 400 of FIG. 4 as having pressure applied at a first location of the flexible contact layer 402 to cause contact of the force sensitive ink 410 with a corresponding first location of the sensor substrate 404. The pressure is illustrated through use of an arrow in FIG. 5 and may be applied in a variety of ways, such as by a finger of a user's hand, stylus, pen, and so on. In this example, the first location at which pressure is applied as indicated by the arrow is located generally near a center region of the flexible contact layer 402 that is disposed between the spacer layers 406, 408. Due to this location, the flexible contact layer 402 may be considered generally flexible and thus responsive to the pressure.

This flexibility permits a relatively large area of the flexible contact layer 402, and thus the force sensitive ink 410, to contact the conductors 412 of the sensor substrate 404. Thus, a relatively strong signal may be generated. Further, because the flexibility of the flexible contact layer 402 is relatively high at this location, a relatively large amount of the force may be transferred through the flexible contact layer 402, thereby applying this pressure to the force sensitive ink 410. As previously described, this increase in pressure may cause a corresponding increase in conductivity of the force sensitive ink and decrease in resistance of the ink. Thus, the relatively high amount of flexibility of the flexible contact layer at the first location may cause a relatively stronger signal to be generated in comparison with other locations of the flexible contact layer 402 that located closer to an edge of the key, an example of which is described in relation to the following figure.

Figure 6:
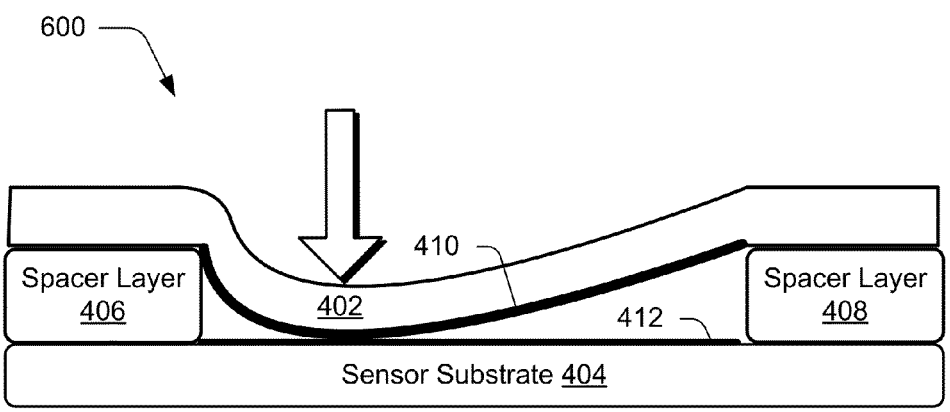
FIG. 6 depicts an example of the pressure sensitive key of FIG. 4 as having pressure applied at a second location of the flexible contact layer to cause contact with a corresponding second location of the sensor substrate.

FIG. 6 depicts an example 600 of the pressure sensitive key 400 of FIG. 4 as having pressure applied at a second location of the flexible contact layer 402 to cause contact with a corresponding second location of the sensor substrate 404. In this example, the second location of FIG. 6 at which pressure is applied is located closer to an edge of the pressure sensitive key (e.g., closer to an edge of the spacer layer 406) than the first location of FIG. 5. Due to this location, the flexible contact layer 402 has reduced flexibility when compared with the first location and thus less responsive to pressure.

This reduced flexibility may cause a reduction in an area of the flexible contact layer 402, and thus the force sensitive ink 410, that contacts the conductors 412 of the sensor substrate 404. Thus, a signal produced at the second location may be weaker than a signal produced at the first location of FIG. 5.

Further, because the flexibility of the flexible contact layer 402 is relatively low at this location, a relatively low amount of the force may be transferred through the flexible contact layer 402, thereby reducing the amount of pressure transmitted to the force sensitive ink 410. As previously described, this decrease in pressure may cause a corresponding decrease in conductivity of the force sensitive ink and increase in resistance of the ink in comparison with the first location of FIG. 5. Thus, the reduced flexibility of the flexible contact layer 402 at the second location in comparison with the first location may cause a relatively weaker signal to be generated. Further, this situation may be exacerbated by a partial hit in which a smaller portion of the user's finger is able to apply pressure at the second location of FIG. 6 in comparison with the first location of FIG. 5.

However, as previously described force concentrator layer techniques may be employed to improve consistency of the contact of the flexible contact layer 402 with the sensor substrate 404 as well as other features, further discussion of which may be found in relation to the following figure.

Figure 7:
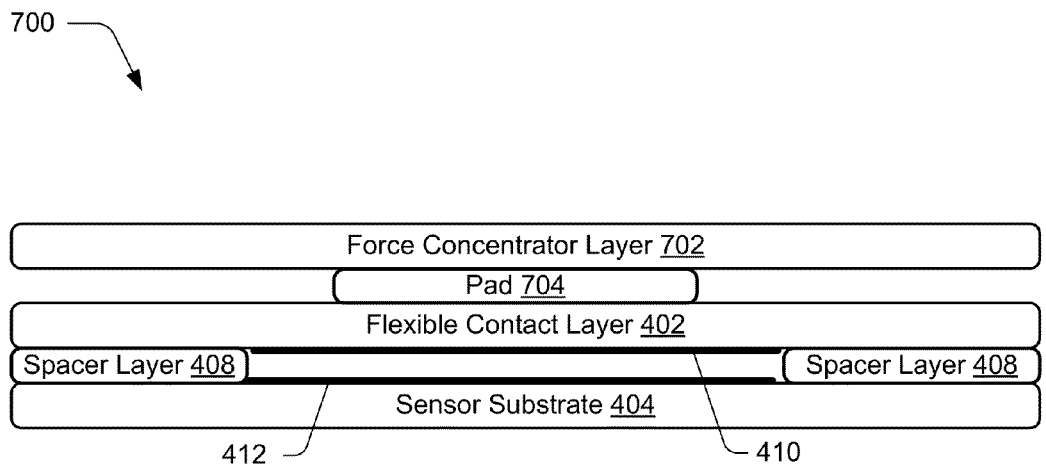
FIG. 7 depicts an example of a pressure sensitive key of FIG. 4 as employing a force concentrator layer.

FIG. 7 depicts an example 700 of a pressure sensitive key of FIG. 4 as employing a force concentrator layer 702. The force concentrator layer 702 may be configured from a variety of materials, such as a flexible material (e.g., Mylar) that is capable of flexing against the flexible contact layer 402.

The force concentrator layer 702 in this instance includes a pad 704 disposed thereon that is raised from a surface of the force concentrator layer 702. Thus, the pad 704 is configured as a protrusion to contact the flexible contact layer 402. The pad 704 may be formed in a variety of ways, such as formation as a layer (e.g., printing, deposition, forming, etc.) on a substrate of the force concentrator layer 702 (e.g., Mylar), as an integral part of the substrate itself, and so on.

Figure 8:
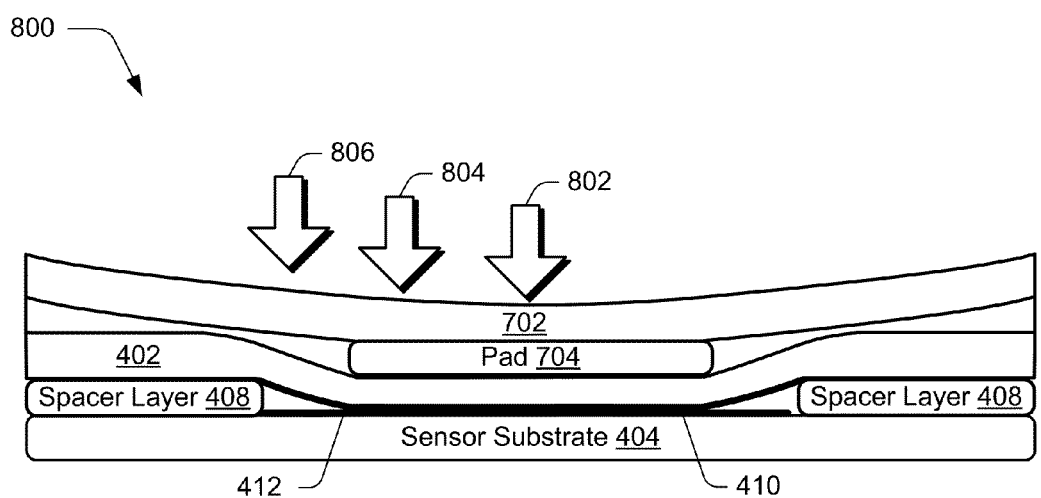
FIG. 8 an example of the pressure sensitive key of FIG. 7 as having pressure applied at a plurality of different locations of the force concentrator layer to cause a flexible contact layer to contact a sensor substrate.

FIG. 8 an example 800 of the pressure sensitive key 700 of FIG. 7 as having pressure applied at a plurality of different locations of the force concentrator layer 702 to cause the flexible contact layer 402 to contact the sensor substrate 404. The pressure is again illustrated through use of arrow, which in this instance include first, second, and third locations 802, 804, 806 which are positioned at distances that are respectively closer to an edge of the key, e.g., an edge defined by the spacer layer 406, 408.

As illustrated, the pad 704 is sized so as to permit the flexible contact layer 402 to flex between the spacer layer 406, 408. The pad 704 is configured to provide increased mechanical stiffness and thus improved resistance to bending and flexing, e.g., as in comparison with a substrate (e.g., Mylar) of the force concentrator layer 702. Therefore, when the pad 704 is pressed against the flexible contact layer 402, the flexible contact layer 402 has a increased bend radius as is illustrated through comparison of FIG. 8 with FIGS. 5 and 6.

Thus, the bending of the flexible contact layer 402 around the pad 704 may promote a relatively consistent contact area between the force sensitive ink 410 and the conductors 412 of the sensor substrate 404. This may promote normalization of a signal produced by the key.

The pad 704 may also act to spread a contact area of a source of the pressure. A user, for example, my press against the force concentrator layer 702 using a fingernail, a tip of a stylus, pen, or other object that has a relatively small contact area. As previously described this could result in correspondingly small contact area of the flexible contact layer 402 that contacts the sensor substrate 404, and thus a corresponding decrease in signal strength.

However, due to the mechanical stiffness of the pad 704, this pressure may be spread across an area of the pad 704 that contacts the flexible contact layer 402, which is then spread across an area of the flexible contact layer 402 that correspondingly bends around the pad 704 to contact the sensor substrate 404. In this way, the pad 704 may be used to normalize a contact area between the flexible contact layer 402 and the sensor substrate 404 that is used to generate a signal by the pressure sensitive key.

The pad 704 may also act to channel pressure, even if this pressure is applied "off center." As previously described in relation to FIGS. 5 and 6, the flexibility of the flexible contact layer 402 may depend at least partially on a distance from an edge of the pressure sensitive key, e.g., an edge defined by the spacer layer 406, 408 in this instance.

The pad 704, however, may be used to channel pressure to the flexible contact layer 402 to promote relatively consistent contact. For example, pressure applied at a first location 802 that is positioned at a general center region of the force concentrator layer 702 may cause contact that is similar to contact achieved when pressure applied at a second location 804 that is positioned at an edge of the pad 704. Pressures applied outside of a region of the force concentrator layer 702 defined by the pad 704 may also be channeled through use of the pad 704, such as a third position 806 that is located outside of the region defined by the pad 704 but within an edge of the key. A position that is located outside of a region of the force concentrator layer 702 defined by the spacer layer 406, 408 may also be channeled to cause the flexible contact layer 402 to contact the sensor substrate 404, an example of which is defined in relation to the following figure.

Figure 9A:
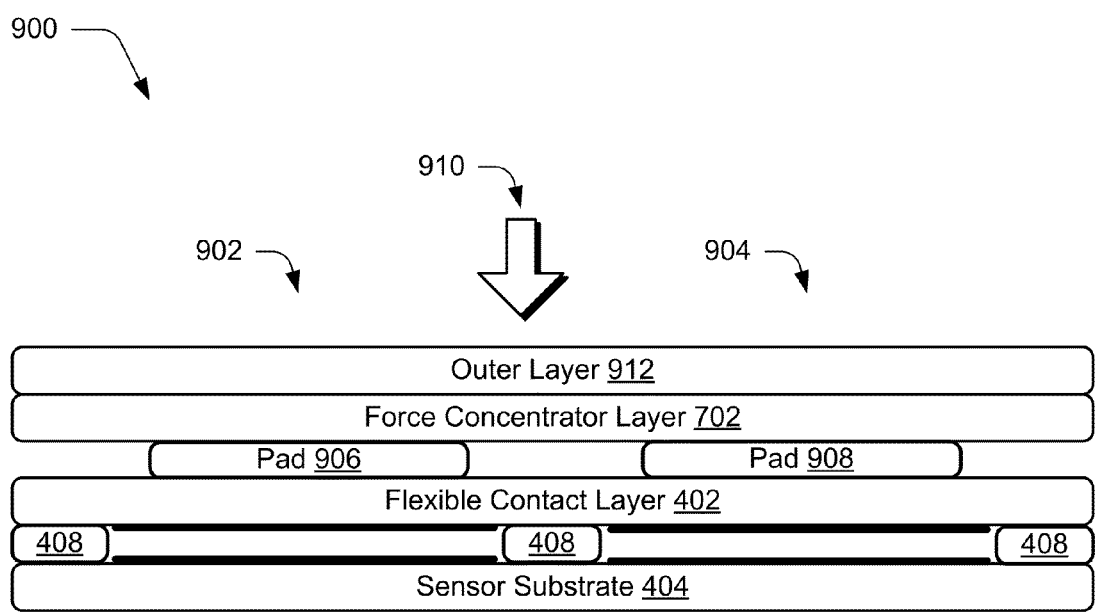
FIG. 9A illustrates an example of a view of a cross section of a keyboard that includes a plurality of pressure sensitive keys that employ the force concentrator layer.

FIG. 9A illustrates an example of a view of a cross section of a keyboard 900 that includes a plurality of pressure sensitive keys that employ the force concentrator layer. The keyboard 900 in this example includes first and second pressure sensitive keys 902, 904. The pressure sensitive keys 902, 904 share a force concentrator layer 702, a flexible contact layer 402, a sensor substrate 404, and a spacer layer 408 as before. Each of the pressure sensitive keys 902, 904 in this example has a respective pad 906, 908 that is configured to channel pressure to cause contact between a respective portion of the flexible contact layer 402 and sensor substrate 404.

As previously described, limited flexibility at the edges of conventional pressure sensitive keys could result in an inability of the keys to recognize pressure applied at the edges of the keys. This could cause "dead zones" in which the input device 104 could not recognize applied pressures. However, through use of the force concentrator layer 702 and channeling of pressure supported by the pads 906, 908 the existence of dead zones may be reduced and even eliminated.

For example, a location 910 is illustrated through use of an arrow that is disposed between the first and second pressure sensitive keys 902, 904. In this instance, the location 910 is disposed over the spacer layer 408 and closer to the first pressure sensitive key 902 than the second pressure sensitive key 904.

Accordingly, the pad 906 of the first pressure sensitive key 902 may channel a greater amount of the pressure than the pad 908 of the second pressure sensitive key 904. This may result in a stronger signal being produce by the first pressure sensitive key 902 than the second pressure sensitive key 904, a signal being generated at just the first pressures sensitive key 902 and not the second pressure sensitive key 904, and so forth. Regardless, modules of the input device 104 and/or the computing device 102 may then determine a likely intent of a user regarding which of the keys is to be employed by processing the signals generated by the keys. In this way, the force concentrator layer 702 may mitigate against dead zones located between the keys by increasing an area that may be used to activate the key through channeling.

The force concentrator layer 702 may also be used to perform mechanical filtering of pressures applied against the keys. A user, for instance, when typing a document may choose to rest one or more fingers of a hand against a surface of the keys but not wish to activate the key. Without the force concentrator layer 702, therefore, processing of inputs from the pressure sensitive keys may be complicated by determining whether an amount and/or duration of pressure applied to the key is likely intended to activate the key.

However, in this example the force concentrator layer 702 may be configured for use with the flexible contact layer to mechanically filter inputs that are not likely to be intended by a user to activate the key. The force concentrator layer 702, for instance, may be configured to employ a threshold that in combination with the flexible contact layer 402 defines an amount of pressure to be employed to actuate the key. This may include an amount of pressure that is sufficient to cause the flexible contact layer 402 and the force sensitive ink 410 disposed thereon to contact conductors 412 of the sensor substrate to generate a signal that is recognizable as an input by the input device 104 and/or computing device 102.

In an implementation, this threshold is set such that a pressure of approximately fifty grams or less is not sufficient to cause the force concentrator layer 702 and the flexible contact layer 402 to initiate the signal whereas pressures above that threshold are recognizable as inputs. A variety of other implementations and thresholds are also contemplated that may be configured to differentiate against a resting pressure and a key strike.

The force concentrator layer 702 may also be configured to provide a variety of other functionality. The input device 104, for instance, may include an outer layer 912 (e.g., fabric, microfiber, and so on) on which indications of operations of respective keys, e.g., letters, numbers, and other operations such as "shift," "return," navigation, and so on. The force concentrator layer 702 may be disposed beneath this layer. Further, a side of the force concentrator layer 702 that is exposed towards the outer layer 912 may be configured to be substantially smooth, thereby reducing and even eliminating witness lines that could result from underlying components of the input device 104.

In this way, a surface of the outer layer 912 may be made with increased uniformity and thus provided a better typing experience with increased accuracy, e.g., by promoting a smooth tactile feel without interference from underlying components. The force concentrator layer 702 may also be configured to protect against electrostatic discharge (ESD) to underlying components of the input device 104. For example, the input device 104 may include a track pad as illustrated in FIGS. 1 and 2 and thus movement across the track pad may generate static. The force concentrator layer 702, however, may protect components of the input device 104 that are exposed beneath the layer from this potential ESD. A variety of other examples of such protection are also contemplated without departing from the spirit and scope thereof.

Figure 9B:
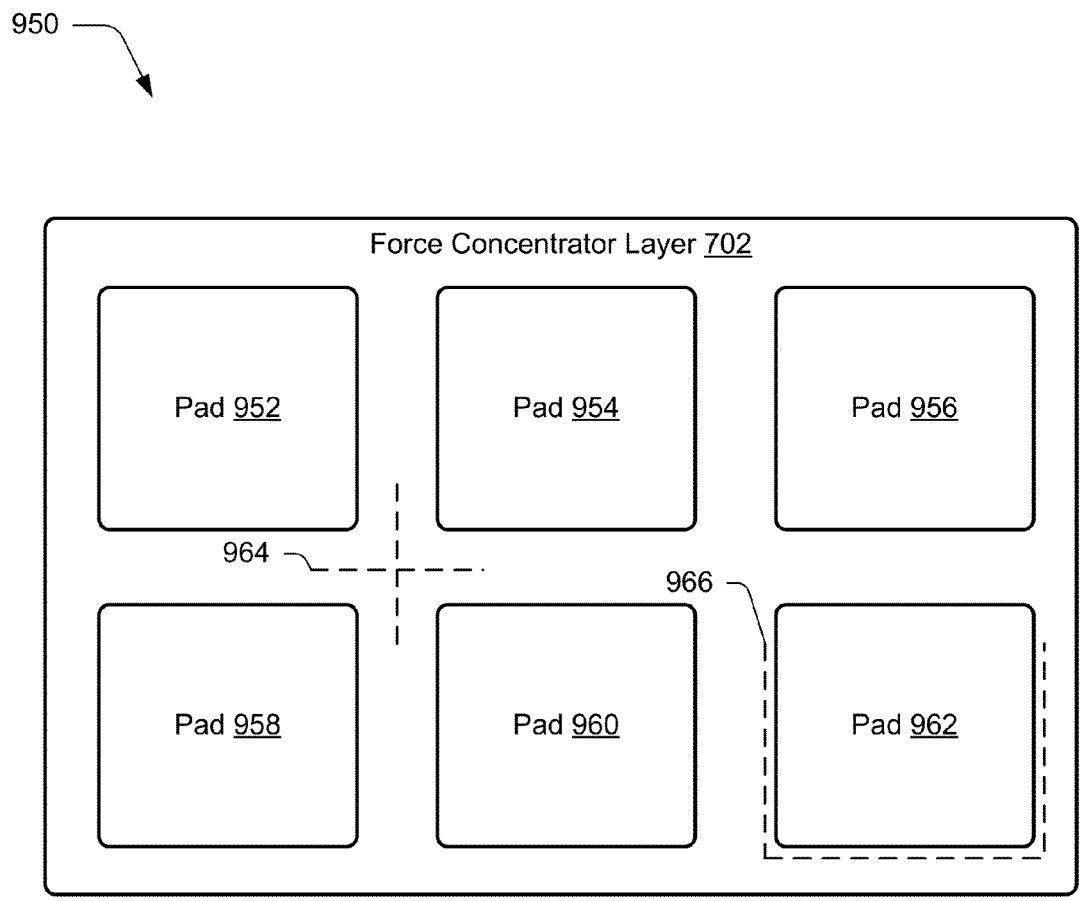
FIG. 9B illustrates an example of a top view of the force concentrator as including one or more cuts to increase flexibility of the layer proximal to the cuts.

FIG. 9B illustrates an example of a top view 950 of the force concentrator as including one or more cuts to increase flexibility of the layer proximal to the cuts. The force concentrator layer 702 in this example includes a plurality of pads 952, 954, 956, 958, 960, 962 as previously described. However, in this example the force concentrator layer includes a plurality of cuts to improve an ability of the layer to move proximal to the cuts.

In a first example, a set of cuts 964 are made at least partially into or through the force concentrator layer 702 to corners of a plurality of respective pads 952, 954, 958, 960. Accordingly, movement of the force concentrator layer 702 proximal to those cuts at the corners of the pads may be changed to include cantilever movement as well as deflection. Thus, by "freeing" portions of the force concentrator layer 702, sensitivity may be increased as desired such as at edges of corresponding keys.

Naturally, a variety of different configurations of cuts are contemplated. For example, as previously described different keys of a keyboard may be configured to address "how" a user is to press the keys. For example, pad 962 may correspond to a key on a bottom row, a track pad, and so on. Accordingly, cuts 966 may be disposed along a plurality of sides to free the force concentrator layer 702 for cantilevered movement. A variety of other examples are also contemplated.

Example System and Device

Figure 10:
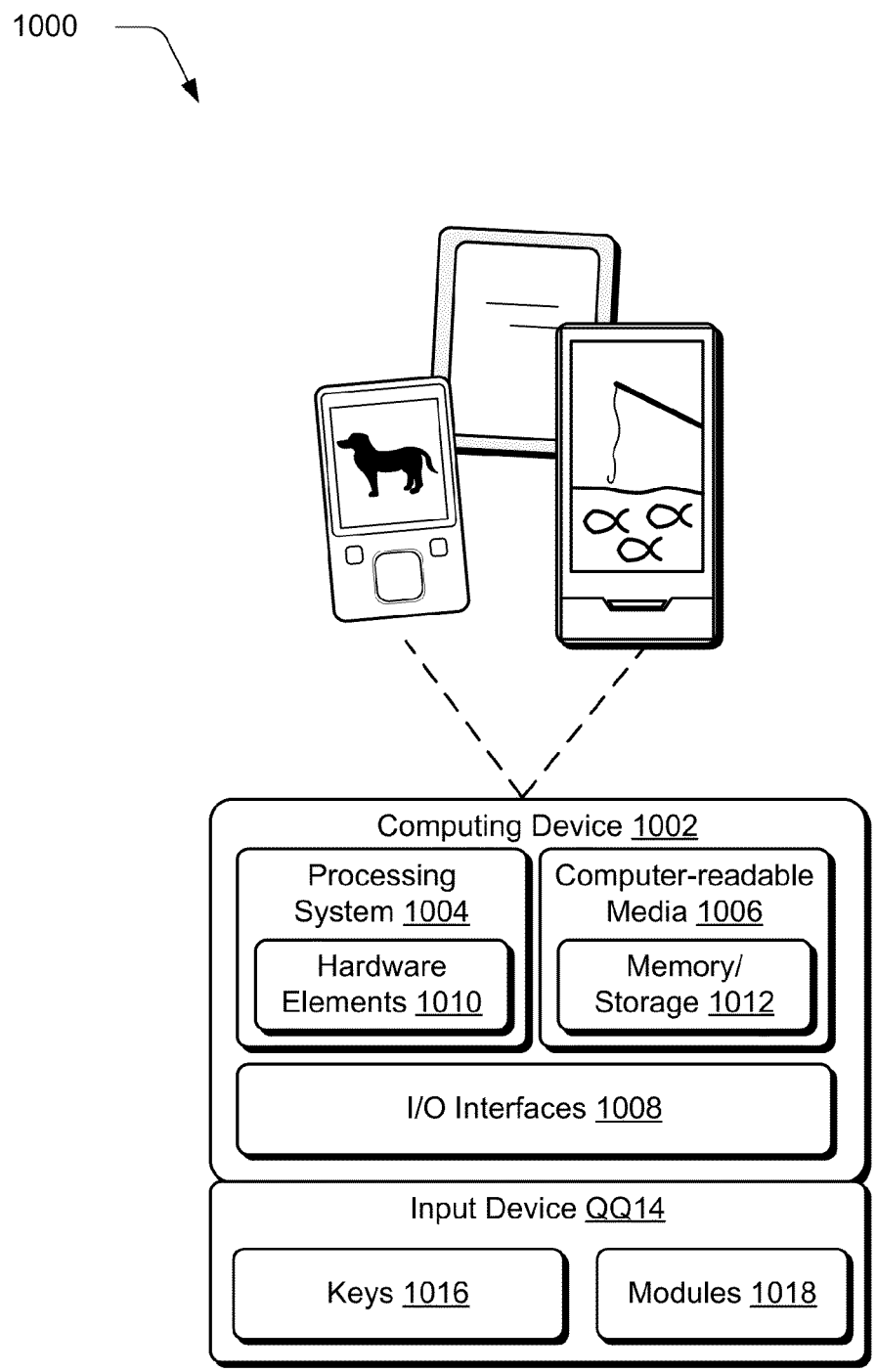
FIG. 10 illustrates an example system including various components of an example device that can be implemented as any type of computing device as described with reference to FIGS. 1-9 to implement embodiments of the techniques described herein.

FIG. 10 illustrates an example system generally at 1000 that includes an example computing device 1002 that is representative of one or more computing systems and/or devices that may implement the various techniques described herein. The computing device 1002 may be, for example, be configured to assume a mobile configuration through use of a housing formed and size to be grasped and carried by one or more hands of a user, illustrated examples of which include a mobile phone, mobile game and music device, and tablet computer although other examples are also contemplated.

The example computing device 1002 as illustrated includes a processing system 1004, one or more computer-readable media 1006, and one or more I/O interface 1008 that are communicatively coupled, one to another. Although not shown, the computing device 1002 may further include a system bus or other data and command transfer system that couples the various components, one to another. A system bus can include any one or combination of different bus structures, such as a memory bus or memory controller, a peripheral bus, a universal serial bus, and/or a processor or local bus that utilizes any of a variety of bus architectures. A variety of other examples are also contemplated, such as control and data lines.

The processing system 1004 is representative of functionality to perform one or more operations using hardware. Accordingly, the processing system 1004 is illustrated as including hardware element 1010 that may be configured as processors, functional blocks, and so forth. This may include implementation in hardware as an application specific integrated circuit or other logic device formed using one or more semiconductors. The hardware elements 1010 are not limited by the materials from which they are formed or the processing mechanisms employed therein. For example, processors may be comprised of semiconductor(s) and/or transistors (e.g., electronic integrated circuits (ICs)). In such a context, processor-executable instructions may be electronically-executable instructions.

The computer-readable storage media 1006 is illustrated as including memory/storage 1012. The memory/storage 1012 represents memory/storage capacity associated with one or more computer-readable media. The memory/storage component 1012 may include volatile media (such as random access memory (RAM)) and/or nonvolatile media (such as read only memory (ROM), Flash memory, optical disks, magnetic disks, and so forth). The memory/storage component 1012 may include fixed media (e.g., RAM, ROM, a fixed hard drive, and so on) as well as removable media (e.g., Flash memory, a removable hard drive, an optical disc, and so forth). The computer-readable media 1006 may be configured in a variety of other ways as further described below.

Input/output interface(s) 1008 are representative of functionality to allow a user to enter commands and information to computing device 1002, and also allow information to be presented to the user and/or other components or devices using various input/output devices. Examples of input devices include a keyboard, a cursor control device (e.g., a mouse), a microphone, a scanner, touch functionality (e.g., capacitive or other sensors that are configured to detect physical touch), a camera (e.g., which may employ visible or non-visible wavelengths such as infrared frequencies to recognize movement as gestures that do not involve touch), and so forth. Examples of output devices include a display device (e.g., a monitor or projector), speakers, a printer, a network card, tactile-response device, and so forth. Thus, the computing device 1002 may be configured in a variety of ways to support user interaction.

The computing device 1002 is further illustrated as being communicatively and physically coupled to an input device 1014 that is physically and communicatively removable from the computing device 1002. In this way, a variety of different input devices may be coupled to the computing device 1002 having a wide variety of configurations to support a wide variety of functionality. In this example, the input device 1014 includes one or more keys 1016, which may be configured as pressure sensitive keys, mechanically switched keys, and so forth.

The input device 1014 is further illustrated as include one or more modules 1018 that may be configured to support a variety of functionality. The one or more modules 1018, for instance, may be configured to process analog and/or digital signals received from the keys 1016 to determine whether a keystroke was intended, determine whether an input is indicative of resting pressure, support authentication of the input device 1014 for operation with the computing device 1002, and so on.

Various techniques may be described herein in the general context of software, hardware elements, or program modules. Generally, such modules include routines, programs, objects, elements, components, data structures, and so forth that perform particular tasks or implement particular abstract data types. The terms "module," "functionality," and "component" as used herein generally represent software, firmware, hardware, or a combination thereof. The features of the techniques described herein are platform-independent, meaning that the techniques may be implemented on a variety of commercial computing platforms having a variety of processors.

An implementation of the described modules and techniques may be stored on or transmitted across some form of computer-readable media. The computer-readable media may include a variety of media that may be accessed by the computing device 1002. By way of example, and not limitation, computer-readable media may include "computer-readable storage media" and "computer-readable signal media."

"Computer-readable storage media" may refer to media and/or devices that enable persistent and/or non-transitory storage of information in contrast to mere signal transmission, carrier waves, or signals per se. Thus, computer-readable storage media refers to non-signal bearing media. The computer-readable storage media includes hardware such as volatile and non-volatile, removable and non-removable media and/or storage devices implemented in a method or technology suitable for storage of information such as computer readable instructions, data structures, program modules, logic elements/circuits, or other data. Examples of computer-readable storage media may include, but are not limited to, RAM, ROM, EEPROM, flash memory or other memory technology, CD-ROM, digital versatile disks (DVD) or other optical storage, hard disks, magnetic cassettes, magnetic tape, magnetic disk storage or other magnetic storage devices, or other storage device, tangible media, or article of manufacture suitable to store the desired information and which may be accessed by a computer.

"Computer-readable signal media" may refer to a signal-bearing medium that is configured to transmit instructions to the hardware of the computing device 1002, such as via a network. Signal media typically may embody computer readable instructions, data structures, program modules, or other data in a modulated data signal, such as carrier waves, data signals, or other transport mechanism. Signal media also include any information delivery media. The term "modulated data signal" means a signal that has one or more of its characteristics set or changed in such a manner as to encode information in the signal. By way of example, and not limitation, communication media include wired media such as a wired network or direct-wired connection, and wireless media such as acoustic, RF, infrared, and other wireless media.

As previously described, hardware elements 1010 and computer-readable media 1006 are representative of modules, programmable device logic and/or fixed device logic implemented in a hardware form that may be employed in some embodiments to implement at least some aspects of the techniques described herein, such as to perform one or more instructions. Hardware may include components of an integrated circuit or on-chip system, an application-specific integrated circuit (ASIC), a field-programmable gate array (FPGA), a complex programmable logic device (CPLD), and other implementations in silicon or other hardware. In this context, hardware may operate as a processing device that performs program tasks defined by instructions and/or logic embodied by the hardware as well as a hardware utilized to store instructions for execution, e.g., the computer-readable storage media described previously.

Combinations of the foregoing may also be employed to implement various techniques described herein. Accordingly, software, hardware, or executable modules may be implemented as one or more instructions and/or logic embodied on some form of computer-readable storage media and/or by one or more hardware elements 1010. The computing device 1002 may be configured to implement particular instructions and/or functions corresponding to the software and/or hardware modules. Accordingly, implementation of a module that is executable by the computing device 1002 as software may be achieved at least partially in hardware, e.g., through use of computer-readable storage media and/or hardware elements 1010 of the processing system 1004. The instructions and/or functions may be executable/operable by one or more articles of manufacture (for example, one or more computing devices 1002 and/or processing systems 1004) to implement techniques, modules, and examples described herein.

CONCLUSION

Although the example implementations have been described in language specific to structural features and/or methodological acts, it is to be understood that the implementations defined in the appended claims is not necessarily limited to the specific features or acts described. Rather, the specific features and acts are disclosed as example forms of implementing the claimed features.

What is claimed is:

1. A pressure sensitive key comprising:
a sensor substrate having one or more conductors;
a flexible contact layer spaced apart from the sensor substrate and configured to flex to contact the sensor substrate to initiate an input; and
a force concentrator layer disposed proximal to the flexible contact layer on a side opposite the sensor substrate, the force concentrator layer having a pad disposed thereon that is configured to cause:
pressure applied to the force concentrator layer to be channeled through the pad and spread across the flexible contact layer to contact the sensor substrate to initiate the input; and
a decrease in a deformation bend radius of the flexible contact layer from that of a contact that applied the pressure to the force concentrator layer such that the pad causes an increase in a contact patch area of the flexible contact layer to contact the sensor substrate responsive to the pressure from that of a contact that applied the pressure to the force concentrator layer.

2. A pressure sensitive key as described in claim 1, wherein the flexible contact layer includes a force sensitive ink.

3. A pressure sensitive key as described in claim 1, wherein the pressure is applied to the force concentrator layer through an off center key strike and the force concentrator layer is configured to channel the pressure to initiate the input.

4. A pressure sensitive key as described in claim 1, wherein the force concentrator layer is configured to act as a mechanical filter such that an amount of pressure below a threshold amount is not channeled in a sufficient amount to cause the flexible contact layer to contact the sensor substrate in an amount that is sufficient to initiate the input.

5. A pressure sensitive key as described in claim 4, wherein the threshold of the force concentrator layer is configured such that pressure resulting from a resting finger is below the threshold and a pressure resulting from a key strike is above the threshold.

6. A pressure sensitive key as described in claim 4, wherein the threshold of the force concentrator layer is configured at approximately fifty grams.

7. A pressure sensitive key as described in claim 1, wherein the pad forms a raised portion in relation to a substrate of the force concentrator layer having a surface that is configured to contact the flexible contact layer.

8. A pressure sensitive key as described in claim 7, wherein an area of the surface is smaller than an area defined by a spacing layer that is configured to space the flexible contact layer from the sensor substrate.

9. A pressure sensitive key as described in claim 1, wherein the pad has a flat surface that contacts the flexible contact layer.

10. A pressure sensitive key as described in claim 1, wherein the force concentrator layer includes a cut at least partially through the layer that increases flexibility proximal to the cut.

11. A pressure sensitive key comprising:
a sensor substrate having a plurality of conductors;
a flexible contact layer spaced apart from the sensor substrate and configured to flex to contact the sensor substrate to initiate an input; and
a flexible force concentrator layer disposed proximal to the flexible contact layer on a side opposite the sensor substrate, the flexible force concentrator layer configured to act as a mechanical filter such that an amount of pressure below a threshold amount is not channeled in a sufficient amount to cause the flexible contact layer to contact the flexible force concentrator layer in an amount that is sufficient to initiate the input, such that pressure resulting from a resting finger is below the threshold and a pressure resulting from a key strike is above the threshold and as having a pad that causes an increase in a contact patch area of the flexible contact layer as contacting the sensor substrate responsive to pressure from that of a contact that applied the pressure to the force concentrator layer.

12. A pressure sensitive key as described in claim 11, wherein the pressure is applied to the force concentrator layer through an off center key strike and the force concentrator layer is configured to channel the pressure to initiate the input.

13. A pressure sensitive key as described in claim 11, wherein the threshold of the force concentrator layer is configured at approximately fifty grams.

14. A pressure sensitive key as described in claim 11, wherein the threshold of the force concentrator layer is configured such that the amount of pressure below the threshold amount does not cause the flexible contact layer to contact the sensor substrate.

15. A keyboard comprising a plurality of pressure sensitive keys formed comprising:
- a sensor substrate having a plurality of conductors;
- a flexible contact layer spaced apart from the sensor substrate and configured to flex to contact the sensor substrate to initiate an input of a respective said key; and
- a force concentrator layer disposed proximal to the flexible contact layer on a side opposite the sensor substrate, the force concentrator layer having:
  - a first side including a pad disposed thereon that is configured to contact the flexible contact layer responsive to pressure applied to the force concentrator layer to be channeled through and spread across the pad to cause the flexible contact layer to contact the sensor substrate to initiate the input of the respective said key with a larger contact area than a contact area that received the applied pressure; and
  - a second side that is substantially smooth; and
- an outer material disposed over the second side of the force concentrator layer, the outer material including indications of the input of the respective said key.

16. A keyboard as described in claim 15, wherein the second side is configured to reduce witness lines that are viewable through the outer material that are caused by components of the keyboard.

17. A keyboard as described in claim 15, wherein the force concentrator layer is configured to protect at least partially against electrostatic discharge.

18. A keyboard as described in claim 15, wherein the force concentrator layer is configured to act as a mechanical filter such that an amount of pressure below a threshold amount is not channeled in a sufficient amount to cause the flexible contact layer to contact the force concentrator layer in an amount that is sufficient to initiate the input.

19. A keyboard as described in claim 15, wherein a plurality of said pads are configured to reduce input force dissipation into non-sensing areas between the plurality of pressure sensing keys.

* * * * *